United States Patent [19]

Sievers et al.

[11] 4,379,990

[45] Apr. 12, 1983

[54] FAULT DETECTION AND DIAGNOSTIC SYSTEM FOR AUTOMOTIVE BATTERY CHARGING SYSTEMS

[75] Inventors: Kirk A. Sievers, Roselle; Robert W. Mortonson, Addison, both of Ill.

[73] Assignee: Motorola Inc., Schaumburg, Ill.

[21] Appl. No.: 152,225

[22] Filed: May 22, 1980

[51] Int. Cl.³ .................... G01R 31/02; G08B 21/00; H02J 7/24

[52] U.S. Cl. ........................... 322/99; 320/48; 322/28; 324/158 MG; 361/21

[58] Field of Search ........... 322/28, 99; 324/158 MG, 324/73; 361/20, 21; 320/48, 64, 68

[56] References Cited

U.S. PATENT DOCUMENTS

| | | | |
|---|---|---|---|
| 3,435,327 | 3/1969 | Merhof et al. | 322/99 |
| 3,629,704 | 12/1971 | Stevens | 324/158 MG |
| 3,733,518 | 5/1973 | Polulyakh et al. | 322/99 X |
| 3,942,097 | 3/1976 | Itoh et al. | 322/99 X |
| 4,019,120 | 4/1977 | Fattic | 322/99 X |

OTHER PUBLICATIONS

Ford 1972 Car Shop Manual 31-10-02.

*Primary Examiner*—R. J. Hickey
*Attorney, Agent, or Firm*—James W. Gillman; James S. Pristelski; Joseph T. Downey

[57] ABSTRACT

An in situ self-diagnostic automotive alternator battery charging system is disclosed. Included are: a battery; voltage regulator sensing battery voltage and generating an excitation signal; and an alternator driven by a vehicle engine provide a rectified electrical signal to charge the battery in response to the excitation signal. Electronic circuit status detectors, variously coupled to the battery, voltage regulator and alternator, maintain a first logic state when a corresponding signal characteristic is within a predetermined range and a second logic state when the corresponding characteristic is outside the predetermined range. Combinatorial logic means respond to a logic state sequence from the detectors to identify predetermined sequences of the logic states resulting in the identification of faults in the charging system. The logic means also provides a warning to the operator of detection of a fault and a display of the location of the fault as occurring in one of the major components of the charging system.

36 Claims, 15 Drawing Figures

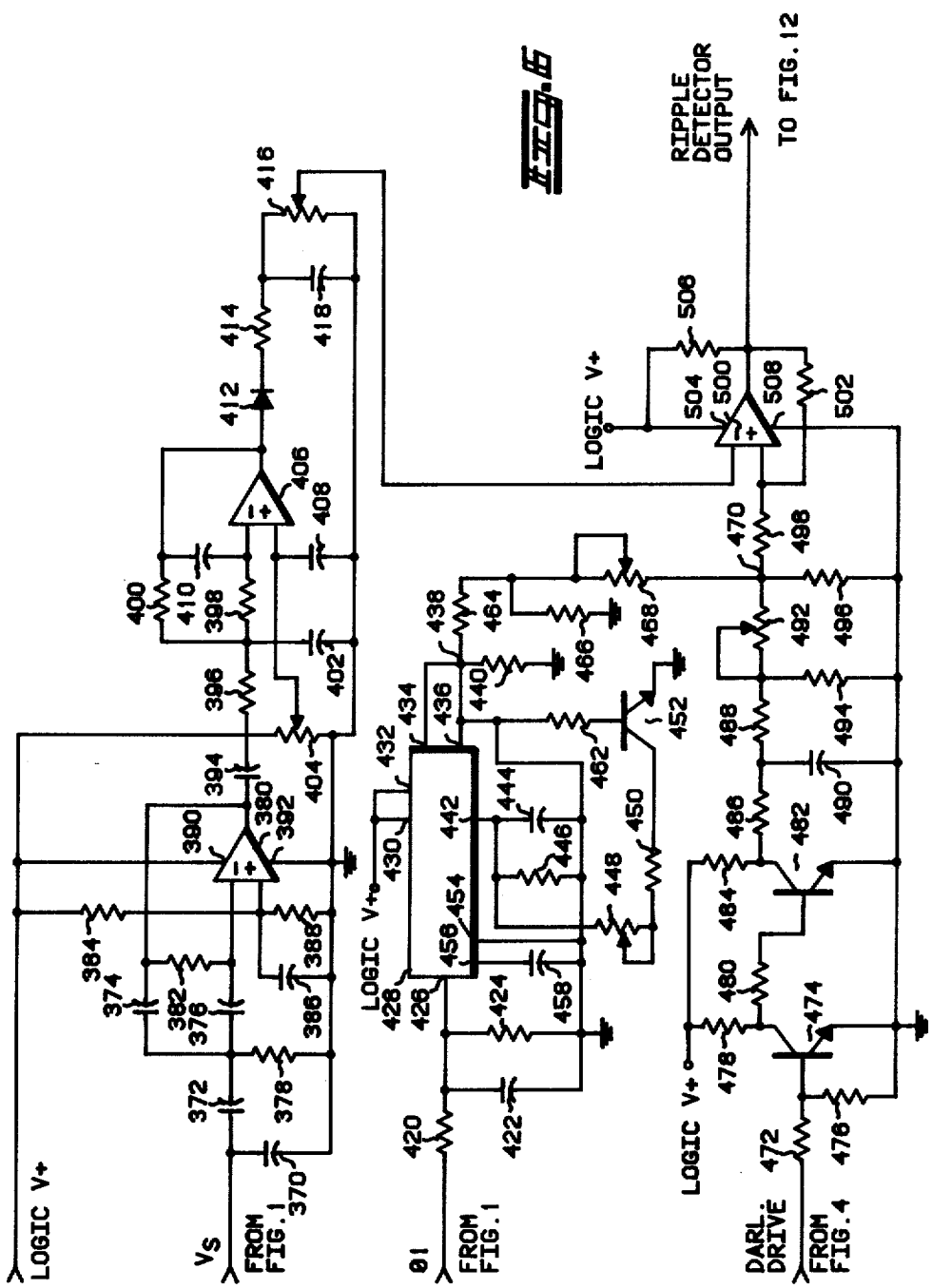

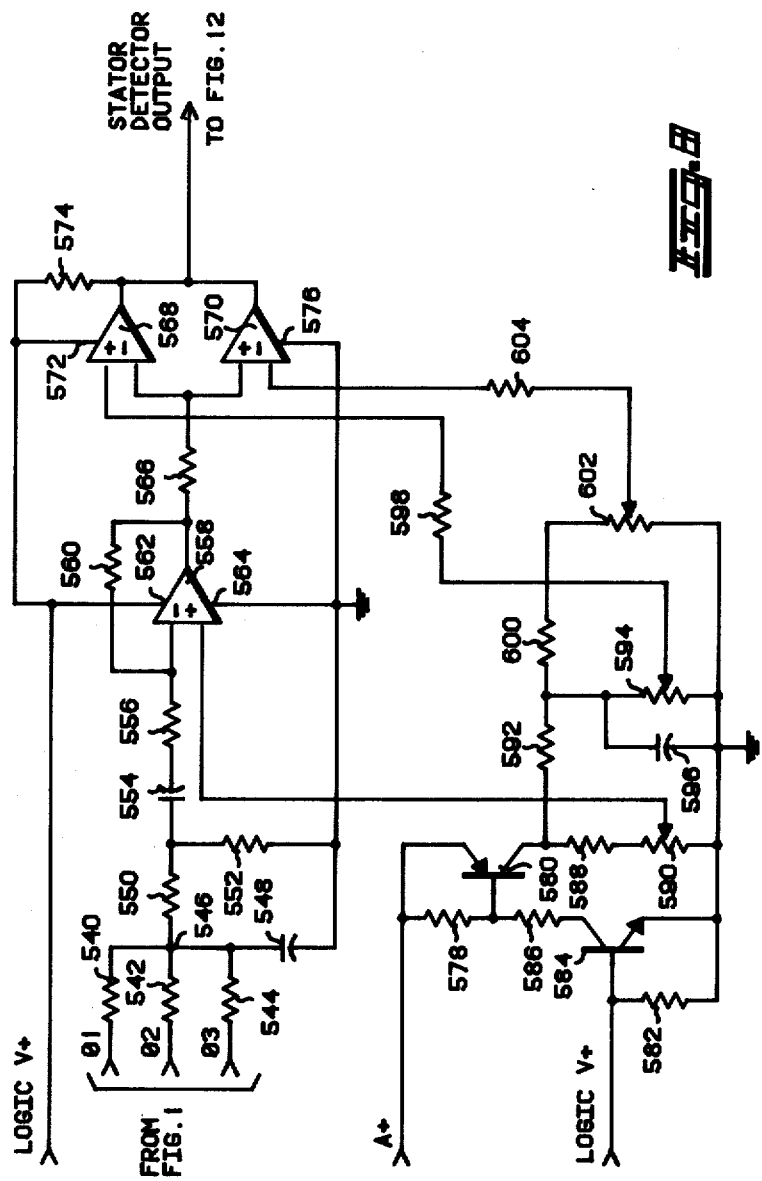

| FAULT | VOLT SENSE DET. | RIPPLE DET. | PHASE DET. | STATOR DET. | FIELD DET. | HIGH DET. | LOW DET. | DARL. DET. |
|---|---|---|---|---|---|---|---|---|
| BROKEN BELT | — | O | — | O | O | O | — | O |
| BLOW FUSE LINK | O | — | O | — | O | O | O | O |
| INSUL. BATT. | O | — | O | — | O | O | O | O |
| UNPLUGGED I | O | — | O | — | O | O | O | O |
| UNPLUGGED S | — | O | O | O | — | — | — | — |
| SHORTED DARL. | O | O | O | O | — | — | O | — |
| DET. Z (HI) | O | O | O | O | — | — | O | — |
| DET. Z (LO) | O | O | O | O | — | — | — | — |
| OPEN DARL. | O | O | O | O | O | O | — | — |
| OPEN FIELD | — | O | — | O | — | O | — | O |
| SHORTED FIELD | — | O | — | O | — | O | — | — |
| STATOR/DIODE FAULT | O | O | O | — | O | O | 10R0 | O |
| SYMBOL | D | E | F | G | H | I | J | K |

FAULT DETECTION AND DIAGNOSTIC SYSTEM FOR AUTOMOTIVE BATTERY CHARGING SYSTEMS

BACKGROUND OF THE INVENTION

1. Field of the Invention

This invention relates generally to the field of fault detection systems for automotive vehicle alternator battery electrical energy circuits which operate to continuously monitor the performance of the circuit when in use.

2. Description of the Prior Art

Voltage regulator controlled automotive battery charging systems are commonly used to keep an automotive storage battery at full charge level and to provide sufficient electrical power for the operation of the various automobile electrical accessories. Normally an alternator is driven by means of a belt-and-pulley arrangement coupled to the internal combustion engine of the automobile to provide a rectified output current. The alternator operation is controlled by a voltage regulator which senses the battery voltage and controls the field coil excitation for the alternator in response to the sensed voltage. An indicator lamp is typically used in such circuits to provide an indication to the automobile operator of the absence of an alternator output to alert the operator of the automobile to a malfunctioning in the electrical system.

In some prior art systems, the DC current is passed through the indicator lamp prior to commencement of the rotation of the alternator rotor to provide the initial alternator field coil excitation. This is the most common method where the steel-pole pieces in the alternator have been designed to retain little or no residual or permanent magnetism and it is, therefore, necessary to pass electrical energy through the field winding to establish the magnetic flux in the presence of the rotor in order to initiate an electrical output. Typically, such prior art systems provide an indicator light warning to the automobile operator only to indicate an alternator malfunction resulting from a low alternator charging output signal. Examples of such prior art systems may be found in U.S. Pat. No. 3,365,646 and U.S. Pat. No. 3,138,751, both of which are assigned to the same assignee as the present invention.

Other prior art systems have recognized the need for providing a visual indication of other possible faults in the alternator, voltage-regulator and battery system. U.S. Pat. No. 3,673,588 assigned to the same assignee as the present invention is an example of such a system and teaches the use of separate sensing circuits to separately excite different display lamps to indicate either high or low voltage conditions.

Another prior art system provides for detection of some fault conditions in an operating alternator battery system. The occurrence of three symptoms primarily due to alternator malfunction are monitored: high voltage, low voltage and excessive ripple. Three separate detectors operate in parallel to turn on the operator indicator light whenever a fixed signal threshold level has been reached for any of the detectors. This system cannot classify or differentiate among the symptoms nor does it provide any protection for the electrical system upon a detection of a fault.

Additional prior systems show fault indicator devices for testing the operation of an alternator, voltage-regulator, battery system by the attachment of an external test circuit device. As is common with all such test equipment, it is designed not to be permanently attached to the alternator-battery-voltage regulator system but rather coupled selectively only for the purpose of diagnosing a malfunction. Normally some of the features of the battery charging system are disabled while the automobile engine is started and various electrical loads drawn to simulate normal operation of the alternator-battery system. With various conductor attachments such test equipment uses either separate indicator lights or a common indicator light or designate different types of generalized malfunctions in the alternator-battery system. Various automobile manufacturers' test manuals show such test equipment and the selective disabling of portions of an automobile alternator-battery system. There is usually a description of manually attaching various cables at predetermined positions in the electrical circuit to monitor the performance of an individual feature under a simulated load. In all cases, the alternator-battery system has been disabled in some manner and the operation is merely a simulated test for that portion to which the test device has been connected.

In another prior external testing system, the ignition switch is disconnected from the circuit with the engine running and a test device is connected to monitor the alternator output. Disconnection of the ignition switch disables the automotive circuit by removing both the battery and accessory electrical loads. A single fault indicator light is used in a constant on mode to indicate a general type of fault which is characterized by voltage spikes and in a flashing mode to indicate an abnormal voltage output. This system merely detects generalized fault characteristics without distinguishing or identifying the fault.

All of the prior art systems use either a single light to indicate a malfunction or a series of display lights coupled to various separate circuits which are individually connected to identify a malfunction. None of these prior art systems has both the advantage of detecting the occurrence of a fault in an operating alternator, voltage-regulator battery system and diagnosing the fault to determine which of the several major electrical component systems may be undergoing a malfunctioning condition. The present invention is intended to be permanently attached to a functioning alternator, voltage-regulator battery system and, at any given time, to indicate not only the fact that a fault has occurred but to identify the major electrical component such as alternator which is undergoing the malfunction.

SUMMARY OF THE INVENTION

It is an object of the present invention to provide an in situ fault detection and diagnostic system for automotive charging systems.

It is another object of the present invention to provide an in situ fault diagnosis and location system for automotive alternator battery charging systems.

An in situ self-diagnostic automotive alternator-battery charging system comprises a battery and voltage regulator means sensing battery voltage and generating an excitation signal in response. Alternator means driven by a vehicle engine are coupled to the battery and voltage regulator means to provide a rectified electrical signal for charging the battery in response to the excitation signal. A plurality of electronic circuit status detectors are provided, each detector maintaining a first logic state when a corresponding electrical signal characteristic is within a predetermined range and a second logic state when the electrical signal characteristic is outside the predetermined range. Selected detectors are coupled to the battery, voltage regulator means and alternator means. Logic means are coupled to the plurality of circuit status detectors and are responsive to the logic output states of the circuit status detectors, to identify predetermined sequences of logic states thereby to identify the occurrence of faults in the charging system.

BRIEF DESCRIPTION OF THE DRAWINGS

FIG. 6 is an electrical schematic of the Ripple Detector portion of FIG. 2.

FIG. 8 is an electrical schematic of the Stator Detector portion of FIG. 2.

DESCRIPTION OF THE PREFERRED EMBODIMENT

Figure 1:
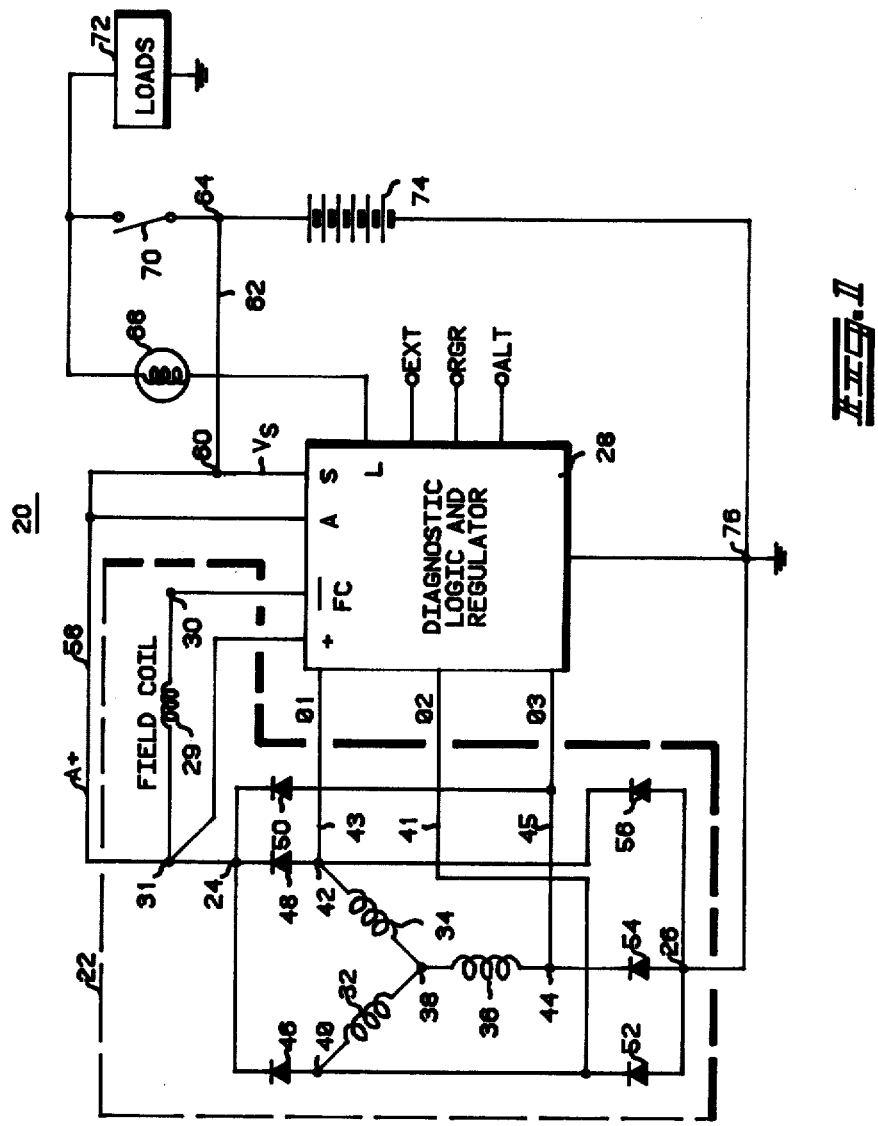
FIG. 1 is a combination block diagram and electrical schematic diagram of an alternator, voltage-regulator and battery system in which the invention is utilized.

Referring more particularly to the drawings, FIG. 1 shows an automotive alternator, voltage-regulator, battery electrical system designated generally as 20. The system includes an alternator 22 (shown enclosed with a broken line) which is driven by the engine to provide both positive and negative rectified output voltages at terminals 24 and 26, respectively. The output voltage from alternator 22 is controlled by a Diagnostic Logic and Regulator module 28. The regulator portion of module 28 monitors the battery voltage at a voltage sensing terminal designated S and provides a controlled excitation signal to a rotatable field coil 29 which is part of the alternator 22. The regulator portion of module 28 functions in a manner similar to known regulators in that when the battery voltage tends to drop, excitation current is supplied to the field coil to energize the alternator field winding to increase the output and, correspondingly, when the system battery voltage tends to rise, the regulator operates to reduce the energy in the field coil circuit of alternator 22 and decrease the voltage supplied to the battery. In addition to the regulator function, module 28 includes the diagnostic logic feature of the present invention which will be described in greater detail later. The inclusion of the diagnostic logic in the regulator module is merely for convenience and it will become evident that the diagnostic logic could be contained in a separate module which is connected into the electrical system.

Alternator 22 comprises three stationary windings designated 32, 34, and 36 which are arranged in a Wye configuration producing a common terminal 38 and output terminals 40, 42, and 44. The common terminal 38 is a result of selecting a Wye configuration for the windings. It will be understood that a Delta winding configuration could equally well be used for the alternator design instead of the present Wye. Each of the terminals 40, 42, and 44 is connected respectively to the anode of the alternator positive rectifying diodes 46, 48, and 50. Similarly, each of the terminals 40, 42 and 44 is connected respectively to the cathodes of negative rectifying diodes 52, 54, and 56. The cathodes of the positive rectifying diodes 46, 48, and 50 are connected at terminal 24, while the anodes of negative rectifying diodes 52, 54, and 56 are connected at terminal 26. Terminals 42, 40 and 44 are connected respectively to Diagnostic Logic and Regulator module 28 by conductors 43, 41 and 45 on which may be found phase signals ∅1, ∅2 and ∅3.

Field coil 29 has a negative terminal 30 connected to Diagnostic Logic and Regulator module 28 at an input terminal designated FC− and positive terminal 31 connected to diagnostic logic and regulator module 28 at a terminal designated FC+. For simplicity in the interconnection with alternator 22, the FC+ terminal and terminal 31 are connected to alternator terminal 24.

Terminal 24 is also connected through a conductor 58 to Diagnostic Logic and Regulator module 28 at input terminal designated A. A+ will be used to designate the output signal from alternator 22 carried by conductor 58. Conductor 58 is also connected to a junction 60 and through a conductor 62 to a junction 64. Junction 60 is is connected to Diagnostic Logic and Regulator module 28 at a terminal designated S which constitutes an input for the voltage signal $V_S$ sensed at junction 60.

Diagnostic Logic and Regulator module 28 has a terminal designated L which is connected through an illuminating lamp 68 to one terminal of the ignition switch 70. Ignition switch 70, when closed, will connect junction 64 to lamp 68 and to automotive electric loads designated by a Block 72. Block 72 represents the collection of all electrical loads of the various accessories within the automobile electrical circuitry and is subsequently connected to ground. The second terminal of ignition switch 70 is connected to junction 64. A Battery 74 has its positive terminal connected to junction 64 and to a negative terminal coupled to ground at junction 76. To complete the circuit, the negative output terminal 26 of alternator 22 is connected also to junction 76.

Module 28 has three additional terminals designated EXT, RGR, and ALT and are intended to represent output terminals which may carry signals resulting from the classification of the diagnostic logic analysis performed when a fault is detected. These signals designate a region or component location in alternator-battery system in which the fault has occurred, as will be explained in greater detail later.

Figure 2:
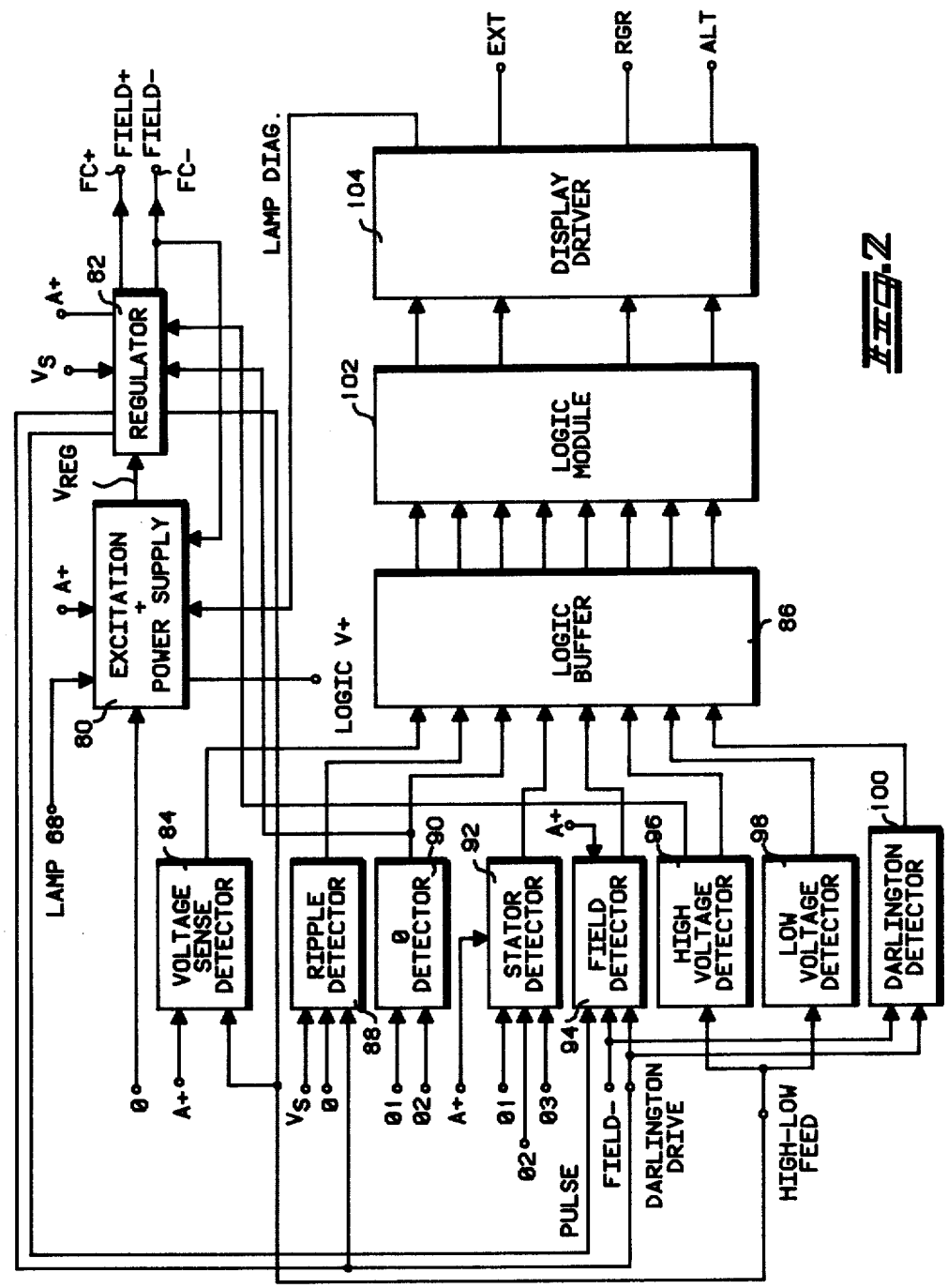
FIG. 2 is a detailed block diagram of the diagnostic logic and regulator portion of FIG. 1 showing the various regulator and logic elements.

FIG. 2 shows a detailed block diagram of the Diagnostic Logic and Regulator module 28 of FIG. 1. Because the Regulator is responsive to some of the same circuit status detection functions that are also required by the Diagnostic Logic portion of module 28, it is convenient to combine the Diagnostic Logic and the Regulator as one module. However, this is merely for the convenience of a compact design and is not intended to be a limitation on the invention.

FIG. 2 shows an Excitation and Power Supply 80 supplying a regulated voltage, $V_{REG}$, to a Regulator 82. Excitation and Power Supply 80 receives one input from the alternator output A+, a second input from any one of the three phases and a third input from lamp 68. The symbol ∅ without an Arabic numeral following will be used to indicate that any of phase signals ∅1, ∅2 or ∅3 is appropriate. Excitation and Power Supply 80 also supplies an output designated Logic V+ which is the logic voltage used to operate all of the diagnostic features of the Diagnostic Logic and Regulator module. The interconnection of the Logic V+ voltage with the various blocks which constitute the Diagnostic Logic module will not be shown except in the detailed circuit schematic diagrams.

Regulator 82 receives an input $V_{REG}$, an input from the $V_S$ signal which is the voltage sensed at junction 60 of FIG. 1 and an input from A+. Regulator 82 has two principal output signals, one designated FIELD+ supplied to terminal FC+ and the second designated FIELD− supplied to terminal FC−. As shown in FIG. 1 these are intended to be signals supplied to the positive terminal 31 and negative terminal 30 of the rotatable field coil 29 of alternator 22. The FIELD− output signal of regulator 82 is also connected to the Excitation and Power Supply 80.

The operation of the Diagnostic Logic portion of module 28 includes interconnections with eight circuit Status detectors which receive signals from various portions of the major components of the electrical circuit which comprise the alternator, voltage-regulator and battery. In particular, a Sense Detector 84 receives a first input signal from Regulator 82 which is designated High-Low Feed and a second input from A+. The output of Sense Detector 84 is coupled to a Logic Buffer 86.

A Ripple Detector 88 receives a first input from the $V_S$ signal and a second input from any of the three phases ∅, and a third input is a Darlington Drive signal from Regulator 82. The output of Ripple Detector 88 is coupled to Logic Buffer 86.

Phase Detector 90 receives inputs from any two of the three possible phases ∅. In particular, ∅1 and ∅2 are shown coupled to the inputs of Phase Detector 90 while the output is coupled both to Logic Buffer 86 and to an input of Regulator 82.

Stator Detector 2 receives an input from A+ and one input each from phase signals ∅1, ∅2, and ∅3. The output of Stator Detector 92 is coupled to Logic Buffer 86.

Field Detector 94 receives three signal inputs from Regulator 82: Pulse, Field−, and Darlington Drive. A fourth input to Field Detector 94 is the A+ signal. The output of Field Detector 94 is coupled to Logic Buffer 86.

High Voltage Detector 96 and Low Voltage Detector 98 each receive an input from High-Low Feed signal from Regulator 82. High Voltage Detector 96 also supplies a signal to Regulator 82. High Voltage Detector 96 and Low Voltage Detector 98 have outputs coupled to Logic Buffer 86.

Darlington Detector 100 receives an input from the Field− signal and an input from the Darlington Drive of Regulator 82. The output of the Darlington Detector 100 is coupled to Logic Buffer 86.

Logic Buffer 86 accepts the eight signal inputs from the eight circuit status detectors, refines these signals, and supplies corresponding signals to Logic Module 102. Logic Module 102 includes combinatorial logic circuits which operate to shift through the various logic signal levels of the detector outputs and establishes a sequence of the logic states of the various circuit status detectors. This sequence of logic states comprises an encoded signal to precisely describe any detectable fault condition which, for the preferred embodiment having eight circuit status detectors with binary logic states, constitutes $2^8$ or 256 possible faults. Logic Module 102 classifies preselected state sequences for the circuit status indicators, grouping them into signals which correspond to the occurrence of a detected fault within a designated principal component of the electrical system. This classification is achieved by analyzing each detected sequence by comparing it with a predetermined empirical analysis of the logic states of the circuit status indicators corresponding to the most probable faults of the major electrical components of the alternator-battery system.

There are four outputs of Logic Module 102 which are connected to a Display Driver 104. Display Driver 104 serves to provide an external indication of the occurrence of a fault within a predetermined specific electrical component or location as decoded by the sequence of logic states. Display Driver 104 has four principal outputs designated LAMP DIAG, EXT, RGR, and ALT. The latter three outputs represent the classification of a fault in one of the principal components of the electrical system which are the external circuit, the regulator and the alternator. The LAMP DIAG (Diagnostic) signal is coupled to Excitation and Power Supply 80. The function of the LAMP DIAG signal along with all of the control interconnections will be described later.

The output designated EXT of Display Driver 104 is actuated when the fault is determined to have occurred within the circuitry which is external to the alternator and regulator. The Lamp Driver output designated RGR is actuated when the fault is determined to have occurred within the regulator and, similarly, Lamp Driver output ALT is actuated when the fault is determined to have occurred within the alternator circuit. The Lamp Driver output designated LAMP DIAG is actuated in conjunction with the actuation of any of EXT, RGR or ALT and whenever the sequence of logic states is other than those for which the location signals EXT, RGR and ALT are actuated. Therefore, the LAMP DIAG signal would be actuated for fault conditions which can not be identified as occurring in either the external circuit, the regulator circuit, or the alternator circuit.

Excitation and Power Supply 80 provides regulated voltage for Regulator 82, Logic V+ for all of the diagnostic logic features of the invention and provides a path for excitation current flow in the field coil to establish magnetic flux linking in the alternator.

Figure 3:
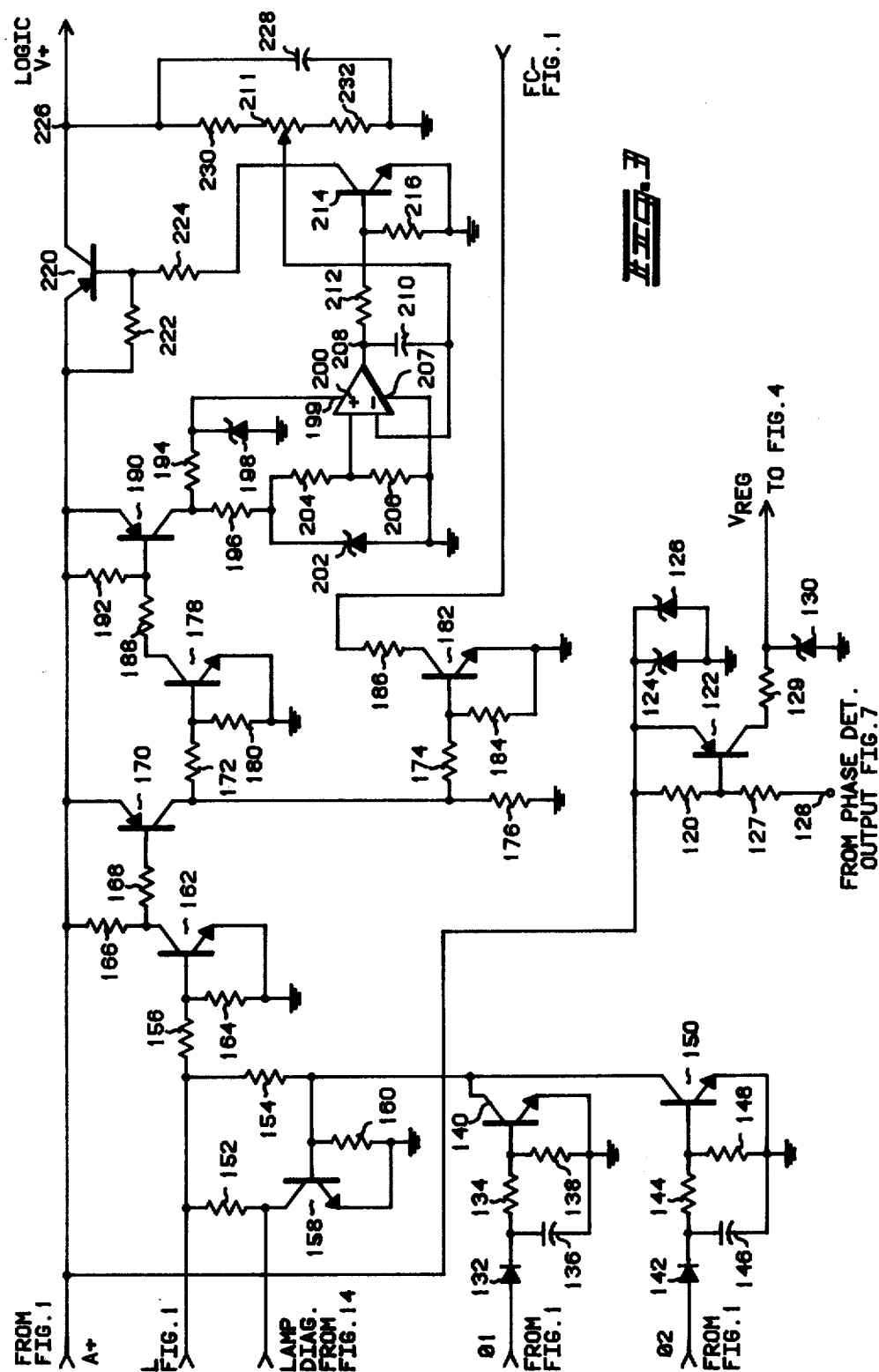
FIG. 3 is an electrical schematic of the Power Supply portion of FIG. 2.

FIG. 3 shows the detailed electrical schematic diagram for Excitation and Power Supply 80 of FIG. 2. In this and all of the subsequent electrical schematics, for the purpose of simplicity, all NPN transistors may be the equivalent of an MPSA05 and all PNP transistors may be the equivalent of a 2N3905. In particular, the alternator output signal A+ is supplied to a first terminal of a resistor 120, the emitter of a PNP transistor 122 and to the cathodes of a pair of Zener diodes 124 and 126 in parallel with their anodes connected to ground. The second terminal of resistor 120 is connected to the base of transistor 122 and the first terminal of resistor 127. The second terminal of resistor 127 is a junction 128 as will be described later which receives an input from the output of Phase Detector 90 shown in FIG. 7. This results from a commonality of certain parts which may be used in both the Phase Detector and Excitation and Power Supply. The collector of transistor 122 is connected through a resistor 129 to the cathode of a Zener diode 130 having its anode connected to ground. At the cathode of Zener diode 130 is a signal designated $V_{REG}$ which is the regulated voltage output supplied to Regulator 82.

Phase signal ∅1 (FIG. 1) is applied to anode of a diode 132 whose cathode is connected to a first terminal of a resistor 134 and one terminal of a capacitor 136. The second terminal of resistor 134 is connected to a first terminal of resistor 138 and to the base of an NPN transistor 140. The second terminals of capacitor 136 and resistor 138 are connected to the emitter of transistor 140 at ground.

Phase signal ∅2 (FIG. 1) is supplied to the anode of a diode 142 whose cathode is coupled to the first terminal of a resistor 144 and to one terminal of a capacitor 146. The second terminal of resistor 144 is coupled to a first terminal of resistor 148 and to the base of an NPN transistor 150. The second terminals of capacitor 146 and resistor 148 are connected to the emitter of transistor 150 at ground. The collector of transistor 150 is coupled to the collector of transistor 140.

Terminal L as shown in FIG. 1 is connected to the first terminals of resistors 152, 154, and 156. The signal from FIG. 14 designated LAMP DIAG is applied to the second terminal of resistor 152 and to the collector of an NPN transistor 158. The base of transistor 158 is connected to the first terminal of a resistor 160, the second terminal of resistor 154 and the common collector interconnections of transistors 140 and 150. The emitter of transistor 158 is connected to the second terminal of resistor 160 at ground. The second terminal of resistor 156 is connected to the base of an NPN transistor 162 and through resistor 164 to ground. The emitter of transistor 162 is also coupled to ground. The alternator output signal A+ is applied through a resistor 166 to the collector of transistor 162 and through a resistor 168 to the base of a PNP transistor 170. The signal A+ is also applied to the emitter of transistor 170.

The collector of transistor 170 is connected to the first terminal of a resistor 172, the first terminal of a resistor 174 and through a resistor 176 to ground. The second terminal of resistor 172 is connected to the base of an NPN transistor 178 and through a resistor 180 to ground. The emitter of transistor 178 is connected to ground. The second terminal of resistor 174 is connected to the base of an NPN transistor 182 and through resistor 184 to ground. The emitter of transistor 182 is connected to ground. The collector of transistor 182 is connected to a first terminal of a resistor 186. The FC- terminal of Regulator 82 of FIG. 2 is connected to the second terminal of resistor 186.

The collector of transistor 178 is connected to the first terminal of a resistor 188 having its second terminal connected to the base of a PNP transistor 190. The signal A+ is connected to the emitter of transistor 190 and through the resistor 192 to the base of transistor 190. The collector of transistor 190 is connected to the first terminals of resistors 194 and 196. The second terminal of resistor 194 is connected to the cathode of a Zener diode 198 with its anode at ground and to terminal 199 of an Operational Amplifier 200. The second terminal of resistor 196 is connected to the cathode of a Zener diode 202 with its anode at ground and through a resistor 204 to the + terminal of OP AMP 200. The positive terminal of OP AMP 200 is also connected through a resistor 206 to ground. Terminal 207 of OP AMP 200 is also coupled to ground. The output of OP AMP 200 is connected to a junction 208. Junction 208 is connected through a capacitor 210 to the negative input terminal of OP AMP 200. The negative input terminal of OP AMP 200 is coupled to the center tap of a potentiometer 211. Junction 208 is connected through a resistor 212 to the base of an NPN transistor 214 and to the first terminal of a resistor 216. The emitter of transistor 214 is connected to the second terminal of resistor 216 at ground. For OP AMP 200 one-half of an integrated circuit of the type LM2904 may be utilized. From the data sheet for this IC, if the DIP "A" device is used then the + and − input terminals correspond to pins 3 and 2 respectively. Terminals 199 and 207 correspond to pins 8 and 4 respectively while the output corresponds to pin 1.

Alternator signal A+ is supplied to the emitter of a PNP transistor 220 and through a resistor 222 to its base. The base of transistor 220 is also connected through resistor 224 to the collector of transistor 214. The collector of transistor 220 is connected to a junction 226 which is connected through a capacitor 228 to ground. Junction 226 is also connected through a resistor 230, the resistive element of potentiometer 211 and a resistor 232 to ground. At junction 226 is an output signal, Logic V+, which provides the appropriate voltage for controlling all of the logic operation of the various circuits.

The A+ signal is always at an elevated voltage due either to the rectified output of the alternator or to the battery. When ignition switch 70 is closed, current flows from the battery through lamp 68 to terminal L. This initial trickle current through the lamp is increased so that there may be sufficient excitation current provided to the alternator to allow the generation of rectified voltage when the automobile engine causes operation of the alternator. The voltage established at resistors 152 and 154 operate to turn on transistor 158 to increase the current drawn through lamp 68. With transistor 158 on, the main current flow for lamp 68 is through resistor 152 and through transistor 158 to ground.

The voltage at terminal L also functions to turn on transistors 162 and 170. Transistor 170 operates through resistor 174 to turn on transistor 182. With transistor 182 on, current from the FIELD− output of Regulator 82 may flow through transistor 182 to ground. The A+ line which is at battery potential is connected to the positive terminal of the field coil which is in parallel with the flyback diode. Resistor 186 controls the initial magnitude of the excitation current and is part of excitation current path for the alternator.

The function of a phase signal in this circuit is to ensure that the alternator is operating normally before a regulated voltage is provided to Regulator 82. It would only be necessary to supply one detected phase signal to turn on either transistor 140 or 150 for this purpose, however, the redundancy in the use of two phase signals allows for the loss of either phase signal with power being supplied to Regulator 82 and to continue the diagnostic logic analysis of a fault in the system. Phase signals ∅1 and ∅2 are connected to peak integrating networks which turn on transistors 140 and 150. With either transistor 140 or 150 on, transistor 158 is turned off and lamp 68 is extinguished. The values of the components are such that some small current does continue to flow through lamp 68, but it is less than the amount necessary to cause illumination. Thus, the initial warning to the driver of the inoperation of the alternator is extinguished when the alternator is determined to be operating.

With transistor 170 on, transistors 178 and 190 are turned on to energize the logic voltage portion of the power supply which is a regulated series pass circuit with an operational amplifier providing the regulating function. The reference voltage is achieved by Zener diode 202 and resistors 200 and 204 and is supplied to the positive input terminal of OP AMP 200. The voltage at the center tap of potentiometer 211 is compared with this reference. Zener diode 198 provides protection for OP AMP 200 from transient voltages which may occur on the A+ conductor 58. Transistor 214 functions as a driver stage for series pass transistor 220.

Excitation and Power Supply 80 also supplies regulated voltage to Regulator 82 but it is advantageous that this voltage be supplied only when the alternator is operating to prevent a drain on the battery. The Phase Detector output signal is connected to the power supply circuit in a manner very similar to the phase signals ∅1 and ∅2. When the Phase Detector circuit has a constant output signal, transistor 122 is turned on and with resistor 128 and Zener diode 130 produces a regulated voltage at the cathode of Zener diode 130. Zener diodes 124 and 126 are provided as protective clamps to prevent the transmission of transients with the A+ signal.

Regulator 82 supplies excitation current to the rotatable field coil in response to the detected voltage. This regulator also supplies a pulsed output for other logic diagnostic functions. The regulator of the present invention is preferably of the type which is disclosed in U.S. Ser. No. 137,334 filed Apr. 4, 1980, entitled "Constant Frequency Automotive Alternator Battery Charging System" which is assigned to the assignee of the present case. Although the details of the present electric schematic are slightly different, the operating principles of the constant frequency regulators are identical.

Figure 4:
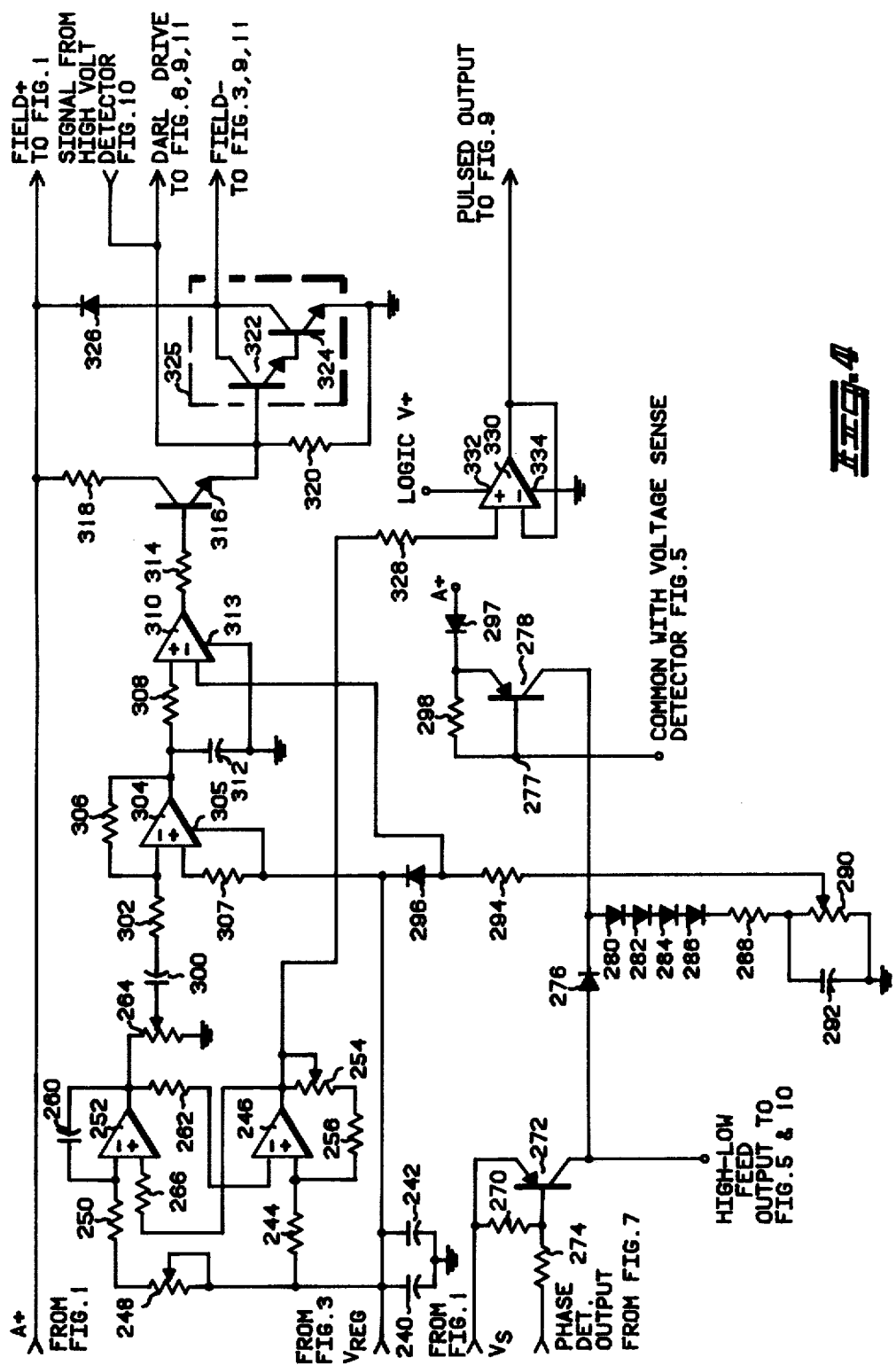
FIG. 4 is an electrical schematic of the Regulator portion of FIG. 2.

FIG. 4 shows the detailed electrical schematic diagram for Regulator 82 of FIG. 2. The signal $V_{REG}$ which constitutes the regulated voltage output as shown in FIG. 3 is applied to a parallel arrangement of capacitors 240 and 242 which have their second terminals connected to ground. The signal $V_{REG}$ is also applied through a resistor 244 to the + input terminal of an Operational Amplifier 246. $V_{REG}$ is applied through a variable resistor 248 in series with a resistor 250 to the negative input terminal of an Operational Amplifier 252. The output of OP AMP 246 is connected through a variable resistor 254 in series with a resistor 256 to its positive input. The output of OP AMP 252 is connected through a capacitor 260 to its negative input terminal.

The output of OP AMP 252 is also connected through a resistor 262 to the negative input terminal of OP AMP 246 and through the resistive element of a potentiometer 264 to ground. The output of OP AMP 246 is also connected through a resistor 266 to the positive input terminal of OP AMP 252.

Figure 7:
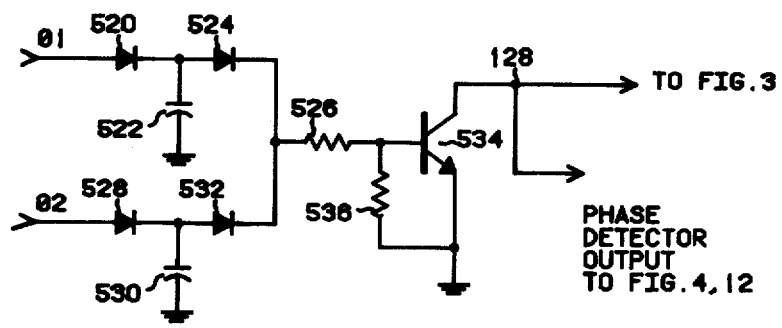
FIG. 7 is an electrical schematic of the Phase Detector portion of FIG. 2.

The voltage signal $V_S$ from FIG. 1 is applied to the first terminal of a resistor 270 and to the emitter of a PNP transistor 272. The output from the Phase Detector, whose detailed schematic is shown in FIG. 7, is connected through a resistor 274 to the second terminal of resistor 270 and to the base of transistor 272. The collector of transistor 272 is an output signal designated High-Low Feed which is supplied to FIGS. 5 and 10. The collector of transistor 272 is also connected to the anode of a diode 276 whose cathode is connected through junction 277 to the collector of a PNP transistor 278. The cathode of diode 276 is also connected to the anode of a diode 280 which is the first of a series arrangement of four diodes connected cathode to anode and designated 280, 282, 284 and 286 respectively. The cathode of diode 286 is connected through a resistor 288 to a parallel arrangement of the resistive element of a potentiometer 290 and a capacitor 292 to ground. The center tap of potentiometer 290 is connected through a resistor 294 to the anode of a diode 296. $V_{REG}$ is applied to the cathode of diode 296.

The alternator output signal A+ is supplied to the anode of a diode 297 whose cathode is coupled to the emitter of transistor 278 and through resistor 298 to the base of transistor 278. The base of transistor 278 is also connected to junction 277 which is in common with the Sense Detector of FIG. 5. This connection is the result of the use of a commonality of parts and its function will be described in detail.

The center tap of potentiometer 264 is connected through a capacitor 300 and a resistor 302 in series to the negative input terminal of an Operational Amplifier 304. The output of OP AMP 304 is connected through a resistor 306 to its negative input terminal. $V_{REG}$ is applied to terminal 305 of OP AMP 304 and through a resistor 307 to the positive input terminal of OP AMP 304.

The output of OP AMP 304 is connected through a resistor 308 to the positive input terminal of an Operational Amplifier 310. The output terminal of OP AMP 304 is also connected through a capacitor 312 to ground. Terminal 313 of OP AMP 310 is also connected to ground. The anode of diode 296 is connected to the negative input terminal of OP AMP 310. The output of OP AMP 310 is connected through a resistor 314 to the base of an NPN transistor 316. The alternator output signal A+ is connected through a resistor 318 to the collector of transistor 316.

The emitter of transistor 316 is connected through a resistor 320 to ground and to the base of an NPN transistor 322. At the emitter of transistor 316 is an output signal designated Darlington Drive which will subsequently be supplied to FIGS. 6, 9, and 11. The base of transistor 322 also may receive a signal from the High Voltage Detector as will be shown in FIG. 10. The function of this signal will be described later. The emitter of transistor 322 is connected to the base of an NPN transistor 324 and the collectors of transistors 322 and 324 are connected in common. The emitter of transistor 324 is also connected to ground. Transistors 322 and 324 are shown enclosed by a broken line and designated as 325 to indicate that they constitute a Darlington amplifier. The commonly connected collectors are coupled to the anode of a diode 326 commonly known as a flyback diode. The cathode of diode 326 is an output signal designated Field+ which is supplied as shown in FIG. 1. As has been described earlier, the A+ output of alternator 22 is coupled in common with the positive terminal 31 of field coil 29 to which the signal Field+ is applied.

OP AMPS 246, 252, 304 and 310 are preferably all of a known type, LM3401. The IC designated LM3401 is a quad package which will provide the four amplifiers required. $V_{REG}$ is shown as applied only to a terminal 305 of OP AMP 304 but this is intended to represent pin 14 of the DIP quad arrangement. Similarly, terminal 313 of OP AMP 310 is grounded and this represents pin 7 of the quad arrangement. The complete identification of OP AMP terminals with IC pins merely depends upon the selection of which of the four OP AMPS in the quad package are to be used as OP AMPS 246, 252, 304 and 310.

The output of OP AMP 246 is connected through a resistor 328 to the positive input terminal of an Operational Amplifier 330. The output of OP AMP 330 is connected to its negative input terminal and is also designated an output signal "Pulsed Output" which is supplied to FIG. 9. Logic V+ is supplied to terminal 332 of OP AMP 330 and terminal 334 of OP AMP 330 is connected to ground. OP AMP 330 is of the type LM2904 which comprises a dual package of operational amplifiers as previously described. Again the pin identification depends upon the selection of one of the devices in the dual package.

OP AMP 246 functions as a Schmidt trigger with an output of a fifty percent duty cycle square wave nominally at 50 Hz. OP AMP 252 and capacitor 260 function as an integrator to produce a triangle wave signal, the frequency of which is nominally 50 Hz. This triangle wave signal is AC coupled with gain control to OP AMP 304 which has a gain controlled by the magnitude of resistors 302 and 306. The DC output level of the signal from OP AMP 304 is controlled by the $V_{REG}$ applied through resistor 307 to the non-inverting input terminal of OP AMP 304. The magnitude of resistor 307 allows for the positioning of the triangle wave at a specific DC level. The output of OP AMP 304 is supplied to the positive input of OP AMP 310 functioning as a comparator. OP AMP 310 compares the triangle wave at the established DC level with the voltage derived from the center tap of potentiometer 290 which is proportional to the voltage sensed at junction 60 of FIG. 1. The string of diodes connected to potentiometer 290 provides temperature compensation.

The output of OP AMP 310 is a variable duty cycle constant frequency pulse train nominally at 50 Hz. This pulse train is supplied to transistor 316 which operates as a driver stage to the base of Darlington Amplifier 325. Diode 326 is the previously described flyback diode which is coupled in parallel with field coil 29.

Signal A+ coupled through diode 297 is connected to transistor 278 and to terminal 277 to provide a protection circuit for the operation of the regulator. Normally a portion of the voltage supplied to the negative input terminal of OP AMP 310 is from terminal S of FIG. 1 which is coupled through transistor 272. In the event of loss of voltage at terminal S, the alternator output signal A+ operating through diode 297 and transistor 278 provides an alternative power source to potentiometer 290 for the comparator operation of OP AMP 310. The alternative power source will enable the regulator operation to continue.

The voltage sensed at junction 60 ($V_S$) is coupled through a transistor 272 at whose base is applied the Phase Detector output from FIG. 7. This interconnection greatly reduces the energy drain on the electrical system since during those periods for which a Phase Detector output is not present, i.e., when the engine is not running, no drain can be made on the battery. Transistor 272 also turns on the High-Low Feed output signal whenever the Phase Detector Output is present.

The output of OP AMP 246 is a square wave signal with a fifty percent duty cycle nominally at 50 Hz and is applied to OP AMP 330 which operates as a buffer to supply the square wave signal to other portions of the system.

The Voltage Sense Detector senses the presence of a voltage signal at junction 60 through Regulator 82 to produce a DC level output signal.

Figure 5:
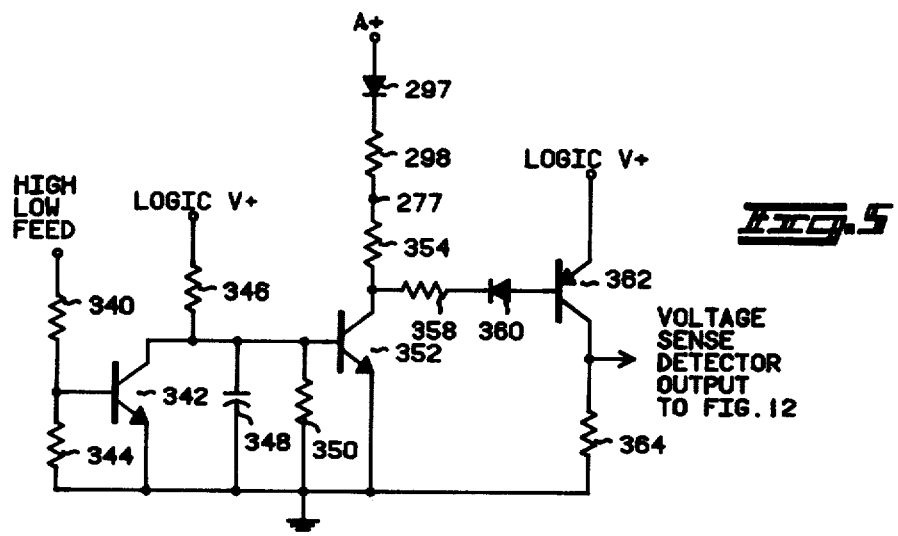
FIG. 5 is an electrical schematic of the Sense circuit portion of FIG. 2.

FIG. 5 shows the detailed electrical schematic for Voltage Sense Detector 84 of FIG. 2. In particular, the High-Low Feed signal from FIG. 4 is applied through a resistor 340 to the base of an NPN transistor 342. The emitter of transistor 342 is coupled through a resistor 344 back to its base. The logic V+ is applied through a resistor 346 to the collector of transistor 342, to the first terminal of a capacitor 348, the first terminal of a resistor 350, and to the base of an NPN transistor 352. The second terminals of resistor 350 and capacitor 348 and the emitter of transistor 342 are connected to ground. The alternator output signal A+ from FIG. 1 is coupled to the anode of a diode 297 whose cathode is connected through resistor 298 to junction 277 and although these components are shown in FIG. 5, they are in common with FIG. 4. Junction 277 is connected through a resistor 354 to the collector of transistor 352. The collector of transistor 352 is also connected through a resistor 358 to the cathode of a diode 360 whose anode is connected to the base of a PNP transistor 362. Logic V+ is applied to the emitter of transistor 362. The collector of transistor 362 is connected through a resistor 364 to the emitter of transistor 352 and to ground. The collector of transistor 362 is also an output signal designated Sense Detector Output and is supplied to FIG. 12.

As with earlier circuits when the alternator is not operating, Voltage Sense Detector 84 is disabled since the High-Low Feed signal is controlled by the output of the Phase Detector. The High-Low Feed signal is only produced when there is voltage at terminal S and the alternator is operating.

If voltage at the terminal S is present, transistor 342 is on while transistor 352 is off. It may be seen that signal A+ connected through diode 297 and transistor 298 connected to junction 277 are repeated in FIG. 5 for the purpose of clarity and it should be remembered that these parts are in common with FIG. 4.

The function of diode 360 is to protect the base emitter junction of transistor 362 since the magnitude of the A+ signal will be on the order of 14 volts while Logic V+ is approximately 5 volts. Capacitor 348 provides a time delay for the turn on of transistor 352 when the ignition switch 70 is initially closed so that the transistor 342 will come on before transistor 352.

Ripple Detector 88 monitors the alternator voltage output signal for voltage ripple and compares the detected ripple with a variable threshold that is adjusted for empirically observed alternator characteristics. This variable threshold is dependent upon both the alternator speed and the field current. Circuitry is included to measure both alternator speed and field current and combine the corresponding signals to produce the variable threshold.

FIG. 6 shows the detailed electrical schematic for Ripple Detector 88 of FIG. 2. The $V_S$ signal (sensing the battery voltage at junction 60 in FIG. 1) is applied through a capacitor 370 to ground. The $V_S$ signal is also applied to the first terminal of a capacitor 372 whose second terminal is coupled to a first terminal of a capacitor 374, the first terminal of a capacitor 376 and through a resistor 378 to ground. The second terminal of capacitor 376 is connected to the negative input terminal of an Operational Amplifier 380. The output of OP AMP 380 is connected to the second terminal of capacitor 374 and through a resistor 382 to its negative input terminal. The Logic V+ voltage is applied through a resistor 384 to the positive input terminal of OP AMP 380. The positive input terminal of OP AMP 380 is connected through a capacitor 386 to ground in parallel with a resistor 388 to ground. The Logic V+ signal is applied to a terminal 390 of OP AMP 380. Terminal 392 of OP AMP 380 is grounded. The output of OP AMP 380 is also connected through a capacitor 394 and a resistor 396 in series to the first terminal of a resistor 398. The first terminal of resistor 398 is also connected to the first terminal of a resistor 400 and through a capacitor 402 to ground. Logic V+ signal is applied to the first terminal of the resistive element of potentiometer 404 whose second terminal is connected to ground. The center tap of potentiometer 404 is coupled to the positive input terminal of an Operational Amplifier 406. The positive input terminal of OP AMP 406 is also connected through a capacitor 408 to ground. The second terminal of resistor 398 is coupled to the negative input terminal of OP AMP 406. The output of OP AMP 406 is coupled to the second terminal of resistor 400 and through a capacitor 410 to its negative input terminal. The output of OP AMP 406 is also connected to the anode of a diode 412 whose cathode is coupled through a resistor 414 to a first terminal of the resistive element of a potentiometer 416 and through capacitor 418 to ground. The second terminal of the resistive element of potentiometer 416 is also connected to ground.

OP AMPS 380 and 406 are preferably of the type LM2904. As described earlier, a LM2904 is a dual OP AMP IC. With OP AMPS 380 and 406 designated as devices A and B in the DIP configuration, respectively, the following pin identifications may be made. The output, —, + terminals of OP AMP 380 correspond respectively to pins 1, 2 and 3. Terminals 390 and 392 correspond to pins 8 and 4 respectively. For OP AMP 406 the +, — and output terminals correspond to pins 5, 6 and 7 respectively.

Phase signal ⌀1 from FIG. 1 is applied through a resistor 420 to the first terminal of a capacitor 422, the first terminal of a resistor 424, and to a terminal 426 of IC 428. The second terminals of capacitor 422 and resistor 424 are connected together at ground. The Logic V+ is applied to two terminals of IC 428 designated 430 and 432. Terminals 434 and 436 of IC 428 are connected to junction 438. Junction 438 is connected through a resistor 440 to ground. Terminal 442 of IC 428 is connected through a capacitor 444 in parallel with a resistor 446 to ground. Terminal 442 is also connected to the first terminal of a variable resistor 448 whose second terminal is connected through a resistor 450 to the collector of an NPN transistor 452. Terminal 454 of IC 428 is connected to ground. Terminal 456 of IC 428 is connected through a capacitor 458 to ground. Junction 438 is connected through resistor 462 to the base of transistor 452. Junction 438 is connected through a resistor 462 to the base of transistor 452. Junction 438 is also connected through a resistor 464 to the first terminal of a resistor 466 whose second terminal is connected to ground. The first terminal of resistor 466 is connected to the first terminal of the resistive element of a variable resistor 468 whose second terminal is coupled to a junction 470. The emitter of transistor 452 is connected to ground.

The signal designated Darlington Drive from FIG. 4 is applied through a resistor 472 to the base of an NPN transistor 474. The base of transistor 474 is also connected through a resistor 476 to ground and the emitter of transistor 474 is connected to ground. Logic V+ is applied through a resistor 478 to the collector of transistor 474. The collector of transistor 474 is also connected through resistor 480 to the base of a NPN transistor 482. The emitter of transistor 482 is connected to ground. The Logic V+ is applied through a resistor 484 to the collector of transistor 482. The collector of transistor 482 is connected to the first terminal of a resistor 486. The second terminal of resistor 486 is connected to the first terminal of a resistor 488 and through a capacitor 490 to ground. The second terminal of resistor 488 is connected to the first terminal of a variable resistor 492. The second terminal of variable resistor 492 is connected to junction 470.

Junction 470 is connected through a resistor 496 to ground and through resistor 498 to the positive input terminal of an Operational Amplifier 500 functioning as a comparator. The output of OP AMP 500 is connected through a resistor 502 to its positive input terminal. The center tap of potentiometer 416 is coupled to the negative input terminal of OP AMP 500. Logic V+ is applied to a terminal 504 and through a resistor 506 to the output of OP AMP 500. A terminal designated 508 of OP AMP 500 is connected to ground. The output of OP AMP 500 is the Ripple Detector Output which is supplied to FIG. 12.

OP AMP 500 is a voltage comparator for which one of the dual LM2903 comparators may be used. Selecting the DIP "A" device for use as OP AMP 500 results in the output, — and + terminals corresponding to pins 1, 2 and 3 respectively. Terminals 504 and 508 correspond to pins 8 and 4 respectively.

IC 428 is preferably an LM2917 frequency to voltage converter, operating to convert the pulse train input signals from phase signal ⌀1 into a voltage corresponding to the speed of the alternator. The terminal-to-pin correspondence for this device is: terminals 426, 430, 432, 434, 436, 442, 454 and 456 correspond respectively to pins 1, 5, 6, 7, 4, 3, 8 and 2.

Ripple detectors were used in the prior art but such devices generally provided a ripple voltage comparison with a fixed threshold. The magnitude of this fixed threshold had to be large enough so that the electrical system would not ordinarily encounter it. The problem with such prior art detectors is that the fixed threshold value for the various combinations of field currents and alternator rotational speeds does not provide accurate detection under all circumstances. This is especially true for lower magnitudes of speed or field current, where it could require an enormous magnitude of ripple to be detected by using the fixed threshold comparison.

In Ripple Detector 88 OP AMP 380 and its associated components constitute an active high-pass filter; while OP AMP 406 and its associated components constitute an active low-pass filter. The $V_S$ signal from FIG. 1 comprises a ripple signal voltage superimposed on a regularly increasing and decreasing DC level. Due to circuit element switching there are noise spikes adjacent to each of the ripple sections. The combination of active high and low-pass filters produce a bandpass circuit to provide a clean ripple signal at a constant DC level which is the output signal of OP AMP 406. The high pass filter at low frequencies eliminates the 50 Hz ramping signal while the low pass filter at high frequencies eliminates the noise spikes primarily due to alternator diode commutation. This output signal is supplied to diode 412 and capacitor 418 which constitute a peak detector whose output is a DC signal proportional to the height of the ripple. This DC signal proportional to the ripple is supplied to the center tap of potentiometer 416.

In order to better analyze the ripple voltage, the speed of the alternator must be known. IC 428 which is of the type LM2917 is a known speed switch. A phase output, in particular ⌀1, is chosen and from the regular occurrence of this signal, the speed of the alternator may be determined. The use of the IC in this circuit would be standard except for the presence of transistor 452 which is coupled to variable resistor 448 and resistor 450. This transistor-resistor combination is connected to the fixed calibration terminal 442 of IC 428. Normally resistor 446 alone would provide the fixed calibration, and the output of IC 428 would be a linear voltage directly proportional to the frequency of the input signal. But transistor 452 is turned on at some voltage, and additional resistance is put in parallel with the normal calibration resistor 446 to alter the frequency to voltage characteristics of IC 428.

It is well known that the general configuration of the ripple voltage versus RPM curve at a fixed value of field current for an automobile alternator does not constitute a straight line but appears to take on a substantially parabolic shape and flatten out to some maximum voltage value. As the magnitude of the field coil current is also varied, an entire family of such curves is generated, with increased field current tending to raise the maximum voltage value at which the flattening occurs. Empirically, for a given alternator and cable impedance, the ripple voltage is proportional to the product of the field coil current and the rotational speed of the alternator. This flattening is due to both the saturation and a counter MMF generated by current in the stator. If the speed switch were not adjusted for this phenomena, the detected ripple voltage corresponding to a given RPM would be considerably higher than that which is empirically observed. It is therefore advantageous to make this modification and the detection of excursions from a normal ripple voltage as a function of RPM are made more realistic for a given alternator.

A complete analysis of the ripple voltage requires that the field current also be known. The Darlington Drive signal is a pulse train nominally at 50 Hz whose duty cycle is proportional to field current. Capacitor 490 functions as an integrator with resistors 484 and 486 providing the time constant to produce a DC level which is proportional to the field current in rotatable field coil 29.

The analysis of the ripple voltage utilizes the combination of the alternator speed and the field current to produce a sliding reference threshold. The alternator speed output from IC 428 is combined with the signal proportional to the field current through variable resistors 492 and 468, respectively. While it would be preferred to generate the product of the field current and the speed as a correction for the combined effects, the voltage at terminal 470 is proportional to the weighted sum of the two signals. At the center tap of potentiometer 416, the DC signal is proportional to the detected ripple. This is applied to the negative input terminal of OP AMP 500 which compares it with the voltage level at terminal 470 which now has been modified to account for the physical characteristics of the saturation and armature reaction of the alternator. If the ripple level for a given speed and field current is too large, OP AMP 500 produces a Ripple Detector Output signal to trigger a fault indication.

The Phase Detector is a peak signal detector containing primarily passive electronic components which responds to the detection of the operation of the alternator.

FIG. 7 shows the electrical schematic for the Phase Detector designated 90 in FIG. 2. Phase signal ⌀1 is applied to the anode of a diode 520 whose cathode is coupled through a capacitor 522 to ground. The cathode of diode 520 is also coupled to the anode of a diode 524 whose cathode is connected to the first terminal of a resistor 526. Phase signal ⌀2 is applied to the anode of a diode 528 whose cathode is connected through a capacitor 530 to ground. The cathode of diode 528 is also connected to the anode of a diode 532 whose cathode is connected to the first terminal of resistor 526. The second terminal of resistor 526 is connected to an NPN transistor 534 whose emitter is coupled through a resistor 536 to its base. The emitter of transistor 534 is also connected to ground. At the collector of transistor 534 is an output signal designated Phase Detector Output which is supplied to FIGS. 4 and 12.

The collector of transistor 534 is connected to a junction 128 which is in common with the circuitry for the Power Supply of FIG. 3. It should be clear that the interconnection to junction 128 is merely the result of the common use of electronic components. In particular, the Phase Detector has been shown to be completely separate from the Power Supply of FIG. 3. It may be observed that the input phase signals and adjacent diode and capacitor connections may be constructed of common parts for both circuits.

The input signals to the Phase Detector are nearly identical to the phase signal inputs of a portion of the Excitation and Power Supply of FIG. 3. However, for the purpose of simplicity, the input signals and components have been separately numerated. The two phase signals ⌀1 and ⌀2 each operate through a diode coupled to a capacitor which form a peak detector. Transistor 534 is turned on when a signal indicating the detection of phase is present. This means that the alternator is operating. If no such phase signal is detected from either ⌀1 or ⌀2, transistor 534 is turned off. Again, the use of two phase signals provides for a redundancy in the design so that even if one phase were not present due to a fault in the system, the Phase Detector would still indicate that the alternator was in operation.

Stator Detector 92 receives the individual phase signals from the alternator and combines them in an artificial neutral for analysis. Window comparators monitor the combined signal for distortion by comparing high and low combined signal values with a reference voltage which is adjusted to account for variations in the DC voltage level in the electrical system.

FIG. 8 shows the electrical schematic for the Stator Detector designated 92 in FIG. 2. Phase signals ø1, ø2 and ø3 are applied respectively through resistors 540, 542, and 544 to a common junction 546. Junction 546 is connected through a capacitor 548 to ground. The first terminal of a resistor 550 is connected to junction 546. The second terminal of resistor 550 is connected through a resistor 552 to ground. The second terminal of resistor 550 is also connected through a capacitor 554 and a resistor 556 in series to the negative input terminal of an Operational Amplifier 558. OP AMP 558 has its output connected through a resistor 560 to its negative input terminal. Logic V+ is supplied to a terminal 562 of OP AMP 558 and terminal 564 is connected to ground.

The output of OP AMP 558 is connected through a resistor 566 to the negative input terminal of an Operational Amplifier 568 functioning as a window comparator and to the positive input terminal of an Operational Amplifier 570 also functioning as a window comparator. Logic V+ is applied to terminal 572 and through a resistor 574 to the output of OP AMP 568. Terminal 576 of an OP AMP 570 is connected to ground. The output of OP AMP 570 is connected to the output of OP AMP 568 and provides a signal designated Stator Detector Output which is supplied to FIG. 12.

Signal A+ is applied through a resistor 578 to the base of a PNP transistor 580. Signal A+ is also applied to the emitter of transistor 580. Logic V+ is connected through a resistor 582 to ground and directly to the base of an NPN transistor 584. The emitter of transistor 584 is connected to ground while its collector is connected through a resistor 586 to the base of transistor 580. The collector of transistor 580 is connected through a resistor 588 to the resistive element of potentiometer 590 which is subsequently connected to ground. The center tap of potentiometer 590 is connected to the positive input terminal of OP AMP 558.

The collector of transistor 580 is connected through a resistor 592 to the resistive element of a potentiometer 594 which is in parallel with a capacitor 596 both of which are subsequently connected to ground. The center tap of potentiometer 594 is connected through a resistor 598 to the positive input terminal of OP AMP 568. The collector of transistor 580 is connected through resistor 592 to a resistor 600 which is connected in series with the resistive element of a potentiometer 602 subsequently connected to ground. The center tap of potentiometer 602 is connected through a resistor 604 to the negative input terminal of OP AMP 576.

OP AMP 558 is a device of the type designated LM2904 which was previously described in detail. OP AMPS 568 and 570 functioning as comparators are preferably a type designated LM2903 previously described.

Stator Detector 92 provides an output signal indicative of the functioning of the stator and the positive and negative diodes. The three phase signals ø1, ø2, and ø3 are connected through individual resistors to common junction 546 which constitutes an artificial neutral. Capacitor 554 and resistor 556 provide AC coupling to OP AMP 558. Logic V+ turns on transistors 584 and 580 so that no current is drawn from A+ when ignition switch 70 is not closed. Stator Detector 92 is capable of detecting all normally occurring faults in the stator including the rectifying diodes. Regardless of the use of either a Delta or Wye design for the alternator, the output signal should be symmetrical. An artificial neutral is formed, and the output signal monitored at this point should also be symmetrical. Window comparators provide for detection if there is a signal excursion either above or below the anticipated value. This detection can be made more precise by having the reference voltage thresholds of the window comparators a function of the electrical system voltage level. The voltage at the center tap of potentiometer 590 tracks the alternator output signal A+, and this is supplied to the positive input terminal of OP AMP 558.

OM AMP 558 receives the AC component of the artificial neutral for the three phases and a reference DC signal level which is proportional to the alternator output signal A+. The output of OP AMP 558 is a signal corresponding to the variations in the magnitude of the A+ signal at a DC level which is proportional to the mean value of the A+ signal. This output is supplied to OP AMPS 568 and 570 functioning as window comparators which are adjusted to detect signal levels just above and just below an anticipated value. The two reference voltages for these window comparators are adjusted by the center taps of potentiometers 594 and 602 which also track the magnitude of the A+ signal. The Stator Detector provides an output signal when distortion of the signal at junction 546 causes one or both of the window comparators to change state. For example, if a diode is shorted, the output from the Stator Detector will not be a steady signal but rather it will have a definite signal pulse component which is repetitive due to the repetitive nature of the generation of three phases. This detection is reflected in the output of the Stator Detector.

Field Detector 94 determines the operational status of the field coil. The two detectable failure modes for the field coil are that it may be either shorted or open.

Figure 9:
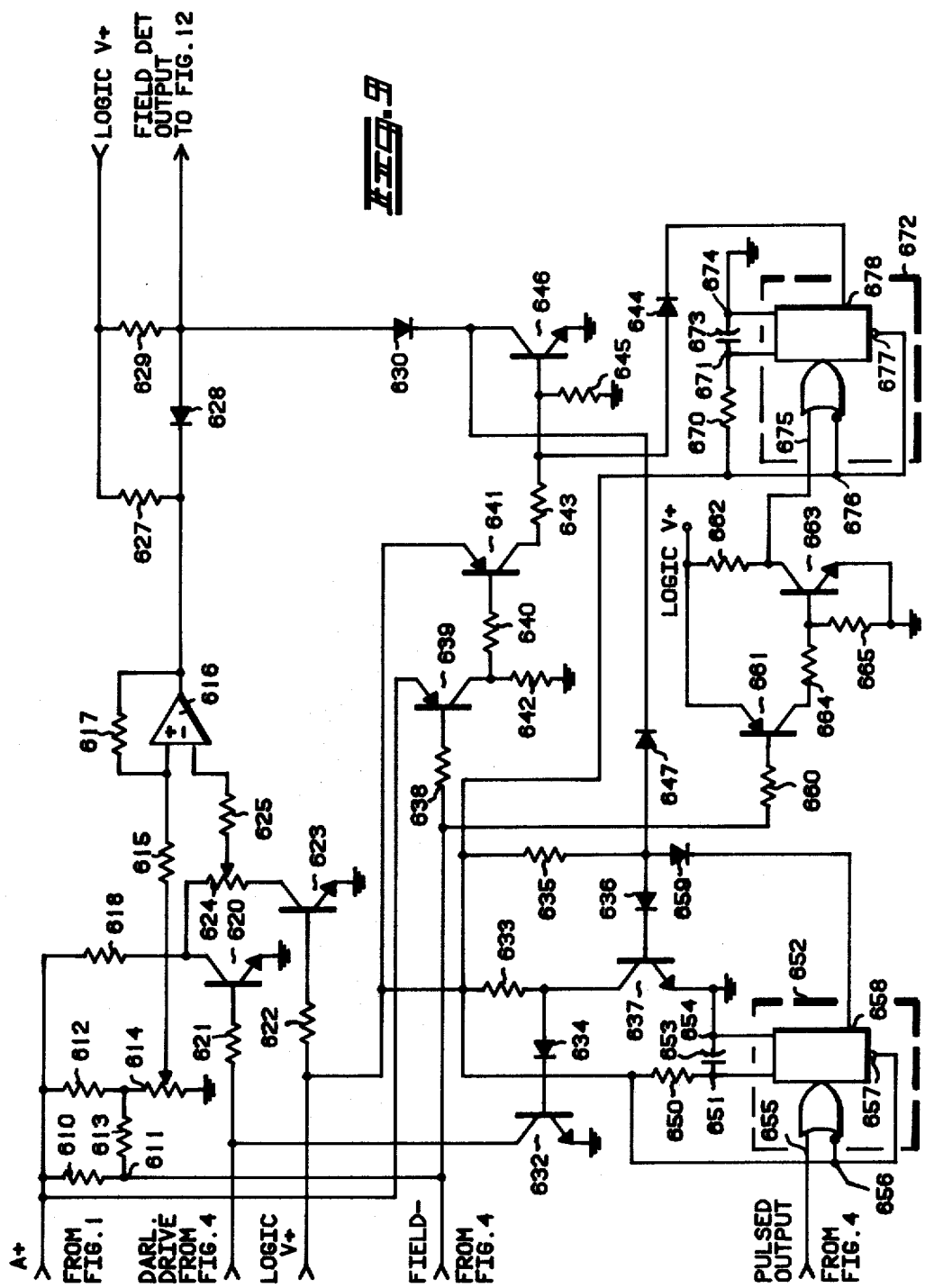
FIG. 9 is an electrical schematic of the Field Detector portion of FIG. 2.

FIG. 9 shows the detailed electrical schematic for Field Detector 94 of FIG. 2. It will be appreciated that some components of the Field Detector may be made common with Darlington Detector 100 in FIG. 2. However, for the purposes of completeness, all of the components will be shown in each electrical schematic with duplicate numbers used for those components which are common.

Alternator signal A+ is applied through a resistor 610 to a junction 611. The Field− signal from FIG. 4 is also applied to junction 611. Signal A+ is applied through a resistor 612 to the first terminal of a resistor 613 whose second terminal is connected to junction 611. The first terminal of resistor 613 is also connected to the resistive element of a potentiometer 614 which is subsequently connected to ground. The center tap of potentiometer 614 is connected through a resistor 615 to the positive input terminal of an operational amplifier 616. The output of OP AMP 616 is coupled through a resistor 617 to its positive input terminal. Signal A+ is applied through a resistor 618 to the collector of an NPN transistor 620. The Darlington Drive signal from FIG. 4 is applied through a resistor 621 to the base of transistor 620. The emitter of transistor 620 is connected to ground. Logic V+ is applied through a resistor 622 to the base of an NPN transistor 623. The emitter of a transistor 623 is connected to ground. The collector of transistor 620 is coupled through the resistive element of a potentiometer 624 and subsequently to the collector of transistor 623. The center tap of potentiometer 624 is connected through a resistor 625 to the negative input terminal of OP AMP 616. Logic V+ is applied through a resistor 627 to the output of OP AMP 616 and the cathode of a diode 628. Logic V+ is applied through resistor 629 to the anode of diode 628 and to the anode of diode 630. At the anode of diode 628 is the Field Detector Output which is supplied to FIG. 12.

The Darlington Drive signal from FIG. 4 is also applied to the collector of an NPN transistor 632. The emitter of transistor 632 is connected to ground. Logic V+ is applied through a resistor 633 to the anode of a diode 634 whose cathode is connected to the base of transistor 632. Logic V+ is also applied through a resistor 635 to the anode of a diode 636 whose cathode is connected to the base of an NPN transistor 637. Transistor 637 has its emitter coupled to ground and its collector coupled to the anode of diode 634.

The Field− signal from FIG. 4 is also applied through a resistor 638 to the base of a PNP transistor 639. Signal A+ is applied to the emitter of transistor 639. The collector of transistor 639 is connected through a resistor 640 to the base of a PNP transistor 641. The collector of transistor 639 is connected through a resistor 642 to ground. Logic V+ is applied to the emitter of transistor 641. The collector of transistor 641 is connected through a resistor 643 to the anode of a diode 644. The anode of diode 644 is also connected through a resistor 645 to ground and to the base of an NPN transistor 646 whose emitter is connected to ground. The collector of transistor 646 is connected to the cathode of diode 630. The anode of a diode 647 is connected to the anode of diode 636 and the cathode of diode 647 is connected to the collector of transistor 646.

Logic V+ is applied through a resistor 650 to terminal 651 of a retriggerable/resettable monostable multivibrator 652 preferably as an integrated circuit shown enclosed by a broken line. Terminal 651 is connected through a capacitor 653 to terminal 654 which is connected to ground. The Pulsed Output signal from Regulator 82 of FIG. 2 is applied to terminal 655 of IC 652 while Logic V+ is also applied to terminals 656 and 657 of IC 652. Terminal 658 of IC 652 is connected to the cathode of a diode 659 whose anode is connected to the anode of diode 636.

Preferably, IC 652 is of the type MC14528B. The standard block logic diagram for such a device includes an OR gate contiguous with a flip-flop which is shown in the electrical schematic. The following is the correspondence between the described terminals and the conventionally labelled terminals of a 4528 device: terminal 651 corresponds to T1; terminal 654 corresponds to T2; terminal 655 corresponds to A; terminal 656 corresponds to B; terminal 657 corresponds to terminal $C_D$ and terminal 658 corresponds to $\overline{Q}$ terminal.

Figures 11, 15:
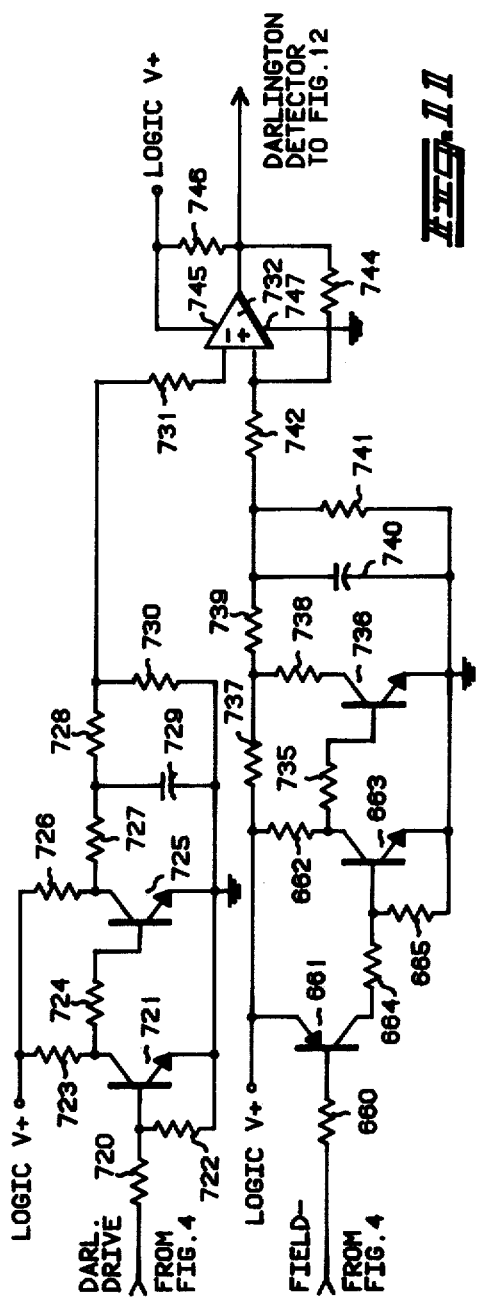
FIG. 11 is an electrical schematic of the Darlington Detector portion of FIG. 2.
FIG. 15 is a logic state diagram showing the logic states of the various electronic circuit status indicators for selected faults in the electrical system.

A second monostable multivibrator also preferably in IC form and shown in this schematic diagram has some portion of the circuitry supplying input signals in common with the Darlington Detector of FIG. 11. For completeness all components will be shown in both figures and identified with common reference numbers.

The Field− input signal from FIG. 4 is applied through a resistor 660 to the base of a PNP transistor 661. Logic V+ is applied directly to the emitter of transistor 661 and through a resistor 662 to the collector of an NPN transistor 663. The collector of transistor 661 is connected through a resistor 664 to the base of the transistor 663. The base of transistor 663 is connected through a resistor 665 to ground. The emitter of transistor 663 is also connected to ground.

Logic V+ is supplied through a resistor 670 to a terminal 671 of a monostable multivibrator 672 in IC form and shown enclosed with a broken line. Terminal 671 is connected through a capacitor 673 to terminal 674 which is also connected to ground. The collector of transistor 663 is connected to terminal 675 of IC 672 and Logic V+ is applied to terminals 676 and 677 of Logic Device 672. The terminal 678 of IC 672 is connected to the cathode of diode 644.

IC 672 is the second monostable multivibrator in this circuit and is preferably of the type MC14528B. For the purposes of identification, terminal 671 corresponds to T1; terminal 674 corresponds to T2; terminal 675 corresponds to A; terminal 676 corresponds to B; terminal 677 corresponds to $C_D$; and terminal 678 corresponds to $\overline{Q}$ of the monostable multivibrator.

As stated earlier, the current in the field coil controls the output of the alternator. The Darlington Drive signal to the Darlington amplifier is a 50 Hz variable duty cycle signal. As the system current demand is increased, the duty cycle is increased. Under maximum current demand condition, the alternator produces a maximum output when the FIELD− signal is on at all times. This is a 50 Hz frequency signal with a 100% duty cycle. But even during a full load condition, the FIELD− signal is disconnected from the field coil for a short sampling period of approximately 20 microseconds every cycle to allow for the detection of the operational condition of the field coil. The Field Detector circuit operates to disrupt the Darlington Drive signal and therefore the FIELD− signal supplied to the field coil. During this sampling time, the field coil is monitored to determine if there is the inductive voltage pulse which would be normal for a correctly functioning coil and flyback diode combination. It will be appreciated that because of the disruption of power to the field coil for even a small percentage of time, the maximum power output of the alternator system will be reduced. Thus, for example, a 100 AMP system could only produce approximately 99 AMPS since power to the field coil would be shut off one percent of the time.

For less than maximum current demand situations, the sampling off time is still triggered by the output of OP AMP 246 in FIG. 4 which is synchronized to the Darlington Drive signal. The leading or positive going edge of the square wave output of the Schmidt trigger (OP AMP 246) occurs precisely in the center of the normal off time of the constant frequency variable duty cycle Darlington Drive signal. For electrical system operation below maximum current demand conditions, the sampling time is still present but its effect is insignificant when compared to the naturally occurring off-time resulting from the less than 100% duty cycle of the nominal 50 Hz frequency. Since the sampling time falls completely within the normal off time signal, there is no change in current output. The one percent diminishment can only begin to occur when the current demand is such that the normal off time for the 50 Hz variable duty cycle FIELD− signal approximates the 20 microsecond sample time.

OP AMP 616 compares the A+ signal from the alternator with a signal sampled from the FIELD− signal only when the Darlington Drive is off. Transistor 620 is gated for a 20 microsecond time period during which the Darlington Drive is low and during this period the comparison in OP AMP 616 is made. If there is a defect in the field and flyback diode combination then the output of OP AMP 616 will produce a logic signal to indicate a fault. This circuit only detects a difference which is less than one diode drop. Thus, if the drop is somewhat more than one diode, this is an acceptable operational condition as the characteristics of the flyback diode may change slightly.

Resettable monostable multivibrator 652 provides a 20 microsecond timing signal which is approximately one percent of the 100% duty cycle of the constant frequency regulator system. Multivibrator 652 receives the pulsed output signal from FIG. 4 and retriggers and re-establishes the 20 microsecond interval each cycle. The Darlington Drive signal is disrupted by being shorted to ground through transistor 632 and this grounds the input to Darlington Amplifier 325 to disrupt the FIELD− signal.

Multivibrator 672 responds to the FIELD− signal and has a resetting time of approximately 60 milliseconds which is approximately three periods of the normal FIELD− signal operating at 50 Hz, so that if two or more pulses fail to occur in the FIELD− signal, transistor 646 will be turned on to change the logic state of the Field Detector Output. This is independent of the detection of the inductive voltage pulse from the field coil and flyback diode circuit and constitutes an additional check on the continued existence of the duty cycle component in the FIELD− signal. While the output of multivibrator 652 provides the time out for the comparison operation, multivibrator 672 functions directly to change the logic state of the detector output unless regular pulses are received from the FIELD− signal. As long as pulses are detected, transistor 646 will be held off and the Field Detector output will indicate a normal signal level.

High Voltage Detector 96 and Low Voltage Detector 98 monitor the voltage sensed at junction 60 to indicate detection of voltages outside a predetermined range.

Figure 10:
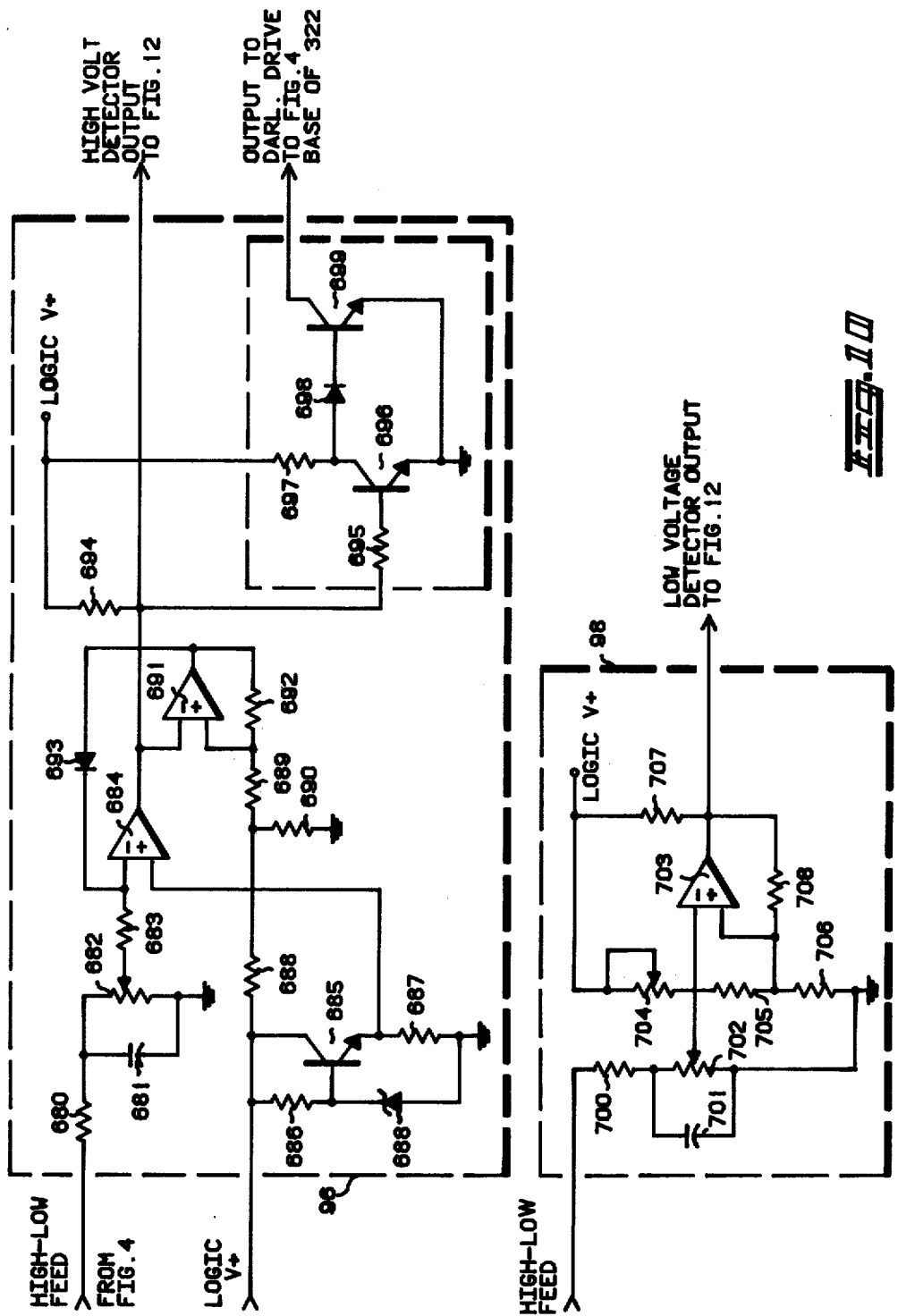
FIG. 10 is an electrical schematic of the High and Low Voltage Detection portions of FIG. 2.

FIG. 10 shows the detailed schematic for the High and Low Voltage Detectors designated 96 and 98, respectively, and shown enclosed by broken lines. The High-Low Feed signal from Regulator 82 of FIG. 2 is applied through a resistor 680 which is connected to a parallel arrangement of capacitor 681 and the resistive element of potentiometer 682 which are subsequently connected to ground. The center tap of potentiometer 682 is connected through resistor 683 to the negative input terminal of an Operational Amplifier 684 functioning as a comparator. Logic V+ is applied to the collector of an NPN transistor 685 and through resistor 686 to the base of transistor 685. The emitter of transistor 685 is connected through a resistor 687 to ground. The base of transistor 685 is connected to the cathode of a Zener diode 688 whose anode is connected to ground. The emitter of transistor 685 is coupled to the positive input terminal of OP AMP 684.

Logic V+ is applied through a resistor 688 to the first terminal of a resistor 689 and through a resistor 690 to ground. The second terminal of resistor 689 is connected to the positive input terminal of an Operational Amplifier 691 functioning as a comparator. The output of OP AMP 691 is connected through resistor 692 to its positive input terminal. The output of OP AMP 691 is also connected to the anode of a diode 693 whose cathode is coupled to the negative input terminal of OP AMP 684. The output of OP AMP 684 is coupled to the negative input terminal of OP AMP 691. Logic V+ is applied through a resistor 694 to the negative input terminal of OP AMP 691 and through a resistor 695 to the base of an NPN transistor 696. Logic V+ is also applied through a resistor 697 to the collector of transistor 696 and to the anode of a diode 698 whose cathode is connected to the base of an NPN transistor 699. The emitters of transistors 696 and 699 are connected to ground. The collector of transistor 699 provides a signal path for the base of transistor 322 in the Darlington amplifier portion of the Regulator circuit shown in FIG. 4.

High-low Feed signal from Regulator 82 is applied through a resistor 700 to a capacitor 701 in parallel with the resistive element of a potentiometer 702 connected to ground. The center tap of potentiometer 702 is connected to the negative input terminal of an Operational Amplifier 703 functioning as a comparator. Logic V+ is applied to the first terminal of a variable resistor 704 connected to resistors 705 and 706 in series to ground. The output of comparator 703 is connected through resistor 704 to its positive input terminal. The positive input terminal of comparator 703 is connected through resistor 706 to ground. Logic V+ is connected through resistor 707 to the output of comparator 703. The output of comparator 703 is the signal designated Low Voltage Detector Output and is supplied to FIG. 12.

OP AMPS 684, 691 and 703 functioning as comparators comprise three-fourths of the quad IC device of the LM2901 type. These are very similar to the comparators as are found in the dual LM2903 package. With OP AMPS 684, 691 and 703 identified as devices 3, 4 and 1 respectively the following pin identifications may be made: the output, − and + terminals of OP AMP 684 correspond respectively to pins 14, 8 and 9; the output, − and + terminals of OP AMP 691 correspond respectively to pins 13, 10 and 11; and the output, − and + terminals of OP AMP 703 correspond respectively to pins 2, 4 and 5.

For High Voltage Detector 96, Logic V+ is applied through transistor 685 to provide a voltage reference for the OP AMP 684. The High-Low Feed signal from FIG. 4 is proportionally reduced by resistor 680 and potentiometer 682 and filtered by capacitor 681. The output of OP AMP 684 is also supplied to OP AMP 691 functioning as a comparator to compare the output with a fixed reference voltage. The output of OP AMP 691 is coupled through a diode 693 back to the negative input terminal of OP AMP 684. This feedback provides a latching operating such that when a High Voltage is detected, the output of OP AMP 684 is latched and remains on to indicate a high voltage fault. This High Voltage Detector output will remain on until the electrical system is shut down.

In addition to the normal logic, the coupling of transistors 696 and 699 shown enclosed by a broken line provide a high voltage protection circuit. When a high voltage is detected, transistor 699 is switched on to ground the Darlington Drive and prevent a drive input signal from being provided to the Darlington amplifier. This ground path through transistor 699 operates as a shunt to ensure that power is no longer supplied to the field coil and is quite similar to the shunting operation of transistor 632 in Field Detector 94.

For Low Voltage Detector 98, the High-Low Feed signal is supplied through a ripple filter 701, adjusted by potentiometer 702 and supplied to the negative input terminal of OP AMP 703 functioning as a comparator. The reference voltage at the positive input terminal is supplied by resistors 704, 705, and 706 operating between Logic V+ and ground. A low value for the signal at the negative input terminal of OP AMP 703 will imply a high level output which will trigger the Low Voltage Detector output. There is no latching function since a low voltage situation does not produce the destructive effects on the vehicle electrical system which could occur in the high voltage case.

The Darlington Drive Detector compares the input signal and output signal of the Darlington amplifier to detect a malfunction in the amplifier.

FIG. 11 shows the detailed electrical schematic for the Darlington Detector designated 100 in FIG. 2. The Darlington Drive signal from FIG. 4 is applied through a resistor 720 to the base of NPN transistor 721. The emitter of transistor 721 is connected to ground. The base of transistor 721 is connected through a resistor 722 to ground. Logic V+ is applied through a resistor 723 to the collector of transistor 721. The collector of transistor 721 is also connected through a resistor 724 to the base of an NPN transistor 725. The emitter of transistor 725 is connected to ground. Logic V+ is also applied through a resistor 726 to the collector of transistor 725. The emitter of transistor 725 is also connected through a resistor 727 to the first terminal of a resistor 728. The first terminal of resistor 728 is connected through a capacitor 729 to ground. The second terminal of resistor 728 is connected through a resistor 730 to ground. The second terminal of resistor 728 is also connected through a resistor 731 to the negative input terminal of an Operational Amplifier 732.

As described for FIG 9, the FIELD— signal from FIG. 4 is applied through a resistor 660 to the base of transistor 661. Logic V+ is applied to the emitter of transistor 661 and through resistor 662 to the collector of transistor 663. The collector of transistor 661 is connected through resistor 664 to the base of transistor 633. The base of transistor 663 is also connected through resistor 665 to ground and the emitter of transistor 663 is connected to ground.

The collector of transistor 663 is connected through a resistor 735 to the base of an NPN transistor 736. Logic V+ is applied through a resistor 737 to the first terminal of a resistor 738. The second terminal of resistor 738 is connected to the collector of transistor 736. The emitter of transistor 736 is connected to ground.

The first terminal of resistor 738 is also connected through a resistor 739 to a parallel arrangement of a capacitor 740 and a resistor 741 which are subsequently connected to ground and through a resistor 742 to the positive input terminal of OP AMP 732. The output of OP AMP 732 is connected through a resistor 744 to its positive input terminal. Logic V+ is applied to a terminal 745 of OP AMP 732 and through a resistor 746 to the output of OP AMP 732. A terminal 747 of OP AMP 732 is connected to ground. The output of OP AMP 732 is a signal designated Darlington Detector which is supplied to FIG. 12.

Darlington Drive Detector 100 is closely associated with the operation of Field Detector of FIG. 9 and comprises two integration circuits with capacitor 729 providing for the integration of the Darlington Drive signal and capacitor 740 providing for the integration of the FIELD— signal. The Darlington Drive signal is directly related to the FIELD— signal since the duty cycle of the Darlington Drive signal is in effect the inverse of the FIELD— duty cycle. OP AMP 732 compares the DC signal levels of the integrated duty cycles. If these DC signal levels differ by an appreciable amount, the detector indicates that a malfunction has occurred in Darlington amplifier 325.

Logic Buffer 86 filters noise from the logic signals of the various circuit status detectors and generates DC logic states for those detectors which produce pulse train logic signals.

Figure 12:
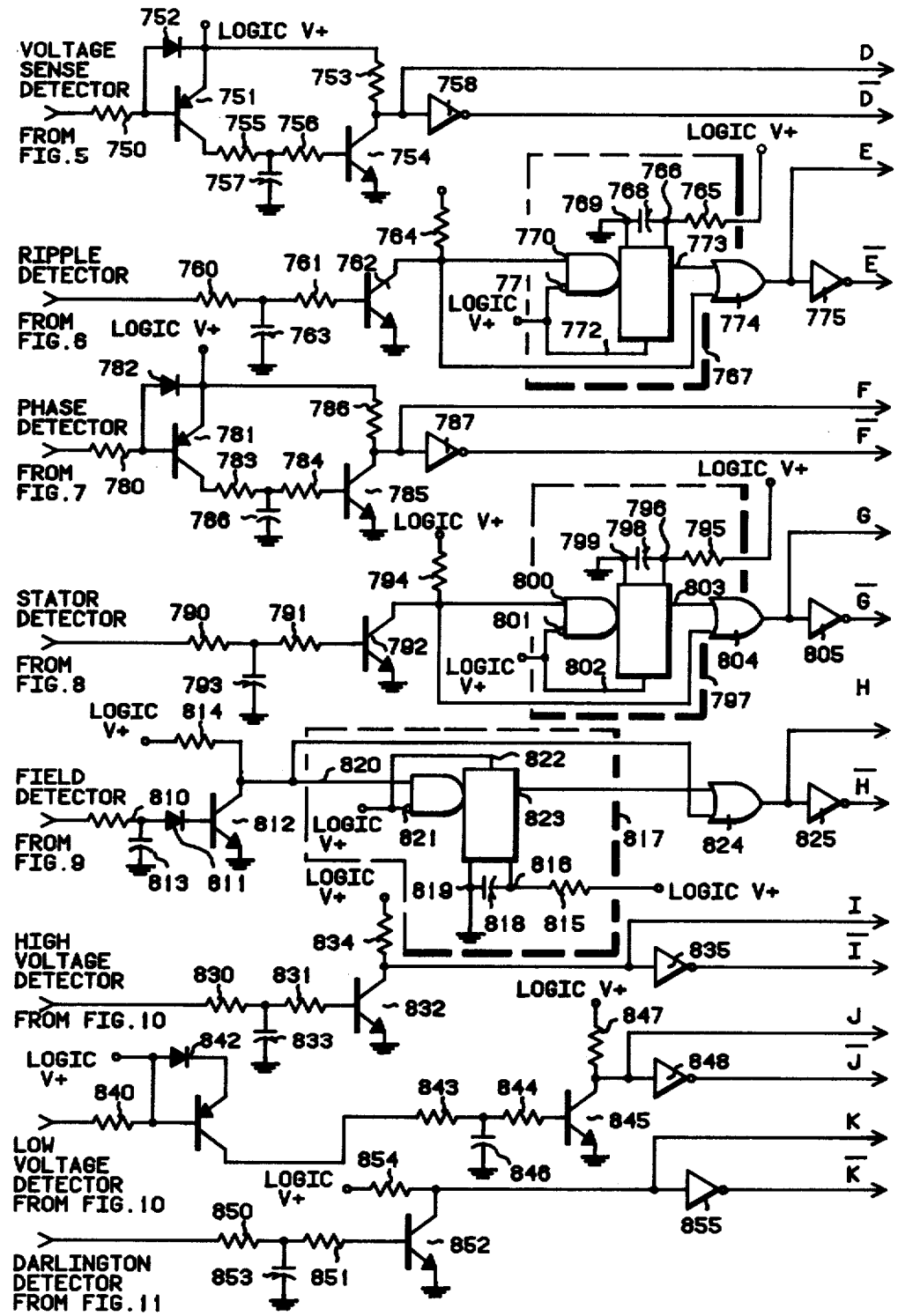
FIG. 12 is an electrical schematic of the Logic Buffer portion of FIG. 2.

FIG. 12 shows the electrical schematic for Logic Buffer 86 of FIG. 2. The output signal from the Sense Detector of FIG. 5 is applied through a resistor 750 to the base of a PNP transistor 751 and to the anode of a diode 752. The cathode of diode 752 is connected to the emitter of transistor 751. Logic V+ is applied to the emitter of transistor 751 and through a resistor 753 to the collector of an NPN transistor 754. The collector of transistor 751 is connected through a resistor 755 to the first terminal of a resistor 756 whose second terminal is connected to the base of transistor 754. The first terminal of resistor 756 is also connected through capacitor 757 to ground. The emitter of transistor 754 is connected to ground. At the collector of transistor 754 is an output signal D. This signal is applied through an inverter 758 to provide an output signal D̄ (inverse).

The output signal from the Ripple Detector of FIG. 6 is applied through a resistor 760 to the first terminal of a resistor 761 whose second terminal is connected to the base of an NPN transistor 762. The first terminal of resistor 761 is also connected through a capacitor 763 to ground. The emitter of transistor 762 is connected to ground. Logic V+ is applied through a resistor 764 to the collector of transistor 762. Logic V+ is also applied through a resistor 765 to a terminal 766 of a retriggerable monostable multivibrator 767 shown enclosed with a broken line. Terminal 766 of multivibrator 767 is connected through a capacitor 768 to a terminal 769 which is also connected to ground. The collector of transistor 762 is connected to terminal 770 of multivibrator 767. Logic V+ is also applied to terminals 771 and 772 of multivibrator 767. The output signal from terminal 773 of multivibrator 767 is connected to a first input of a OR gate 774. The collector of transistor 762 is connected to the second input of OR 774. At the output of OR 774 is a signal E and the output of OR 774 is connected through an inverter 775 whose output is a signal Ē (inverse).

The signal from the output of the Phase Detector of FIG. 7 is applied through a resistor 780 to the base of a PNP transistor 781 and to the anode of a diode 782. The cathode of diode 782 is connected to the emitter of transistor 781. Logic V+ is applied to the emitter of transistor 781. The collector of transistor 781 is connected through a resistor 783 to the first terminal of a resistor 784 whose second terminal is connected to the base of an NPN transistor 785. The first terminal of resistor 784 is also connected through a capacitor 786 to ground. The emitter of transistor 785 is connected to ground. Logic V+ is applied through a resistor 786 to the collector of transistor 785. At the collector of transistor 785 is also a signal F which is also applied through an inverter 787 to produce a signal F̄ (inverse).

The output signal from the Stator Detector of FIG. 8 is applied through a resistor 790 to the first terminal of a resistor 791 whose second terminal is connected to the base of an NPN transistor 792. The first terminal of resistor 791 is connected through a capacitor 793 to ground. The emitter of transistor 792 is also connected to ground. Logic V+ is applied through a resistor 794 to the collector of transistor 792. Logic V+ is also applied through a resistor 795 to a terminal 796 of a monostable multivibrator 797 shown enclosed with a broken line. Terminal 796 is connected through a capacitor 798 to a terminal 799 of multivibrator 797. Terminal 799 is also connected to ground. The collector of transistor 792 is connected to a terminal 800 of monostable multivibrator 797. Logic V+ is applied to terminals 801 and 802 of multivibrator 797. Terminal 803 of multivibrator 797 is connected to the first terminal of an OR gate 804. The collector of transistor 792 is connected to the second input of OR 804. At the output of OR 804 is a signal G which is also applied through an inverter 805 to produce a signal $\overline{G}$ (inverse).

The output from the Field Detector of FIG. 9 is applied through a resistor 810 to the anode of a diode 811 whose cathode is connected to the base of an NPN transistor 812. The anode of diode 811 is also connected through a capacitor 813 to ground. Logic V+ is applied through a resistor 814 to the collector of transistor 812. Logic V+ is applied through a resistor 815 to a terminal 816 of a monostable mutivibrator 817 shown enclosed with a broken line. The terminals of multivibrator 817 have been repositioned from the standard form to conserve space in this figure. The terminals are all numbered and will subsequently be identified with corresponding pins of an IC device. Terminal 816 of multivibrator 817 is connected through a capacitor 818 to terminal 819 which is connected to ground. The collector of transistor 812 is connected to a terminal 820 of multivibrator 817. Logic V+ is applied to terminals 821 and 822 of multivibrator 817. Terminal 823 of multivibrator 817 is connected to the first input of an OR gate 824 and the collector of transistor 812 is coupled to the second input of OR 824. At the output of OR 824 is a signal designated H which is also applied through an inverter 825 to produce an output signal $\overline{H}$ (inverse).

Multivibrator 767 is preferably of the MC14528B type described earlier, and it should be appreciated that terminals 766, 769, 770, 771, 772 and 773 correspond respectively to terminals T2, T1, A, B, $C_D$ and Q for the equivalent logic diagram of the MC14528B device.

Multivibrators 797 and 817 are also preferably of the MC14528B type having the following correspondence between terminals and pins: 796 and 818 to pin T1; 799 and 819 to pin T2; 800 and 820 to pin A; 801 and 821 to pin B; 802 and 822 to pin $C_D$; and 803 and 823 to Q.

The output signal from the High Voltage Detector of FIG. 10 is applied through a resistor 830 to the first terminal of a resistor 831 whose second terminal is to the base of an NPN transistor 832. The first terminal of resistor 831 is connected through a capacitor 833 to ground. The emitter of transistor 832 is also connected to ground. Logic V+ is applied through a resistor 834 to the collector of transistor 832. At the collector of transistor 832 is a signal I and which is also applied through an inverter 835 to provide a signal $\overline{I}$ (inverse).

The output signal from the Low Voltage Detector of FIG. 10 is applied through a resistor 840 to the base of a PNP transistor 841. Logic V+ is applied to the base of transistor 841 and to the anode of a diode 842 whose cathode is connected to the emitter of transistor 841. The collector of transistor 841 is connected through a resistor 843 to the first terminal of a resistor 844 whose second terminal is connected to the base of an NPN transistor 845. The first terminal of resistor 844 is also connected through a capacitor 846 to ground. Logic V+ is applied through a resistor 847 to the collector of transistor 845. At the collector of transistor 845 is a signal J which is also applied through an inverter 848 to produce a signal $\overline{J}$ (inverse).

The output signal from the Darlington Detector of FIG. 11 is applied through a resistor 850 to the first terminal of a resistor 851 whose second terminal is connected to the base of an NPN transistor 852. The first terminal of resistor 851 is also connected through a capacitor 853 to ground. Logic V+ is applied through a resistor 854 to the collector of transistor 852. At the collector of transistor 852 is a signal K which is also applied through an inverter 855 to produce a signal $\overline{K}$ (inverse).

Although shown separately, Logic Buffer 86 comprises eight separate circuits for completing the detection operation of the circuit status detectors. It is advantageous to provide these circuits separate from the detectors since they could be implemented in C-MOS along with Logic Module 102 which will be subsequently described.

Logic Buffer 86 employs the use of filter capacitors to remove any noise spikes from the logic signals of the Riple Detector, the Stator Detector, the Field Detector, the High Voltage Detector and the Darlington Detector. The Sense, Phase and Low Voltage Detectors do not require filtering. Generally, transistors are used to invert logic signals and two transistors provide double inversion. The final logic state output uses an inverter to provide the inverse logic state. The logic signals from the Sense Detector, the Phase Detector, the High Voltage Detector, the Low Voltage Detector and the Darlington Detector are DC signals while the logic signals from the Ripple Detector, the Stator Detector and the Field Detector are pulse trains.

For each of the pulse train signals, a monostable multivibrator is used with a predetermined time such that as long as pulses continue to be detected, the multivibrator is reset to provide additional time periods. Thus, the absence of pulses in a detector logic signal which should normally produce a pulse train indicates that a failure has been detected in the corresponding detector. The Ripple Detector and Stator Detector logic signals are analyzed with a timing period of 35 milliseconds resulting in rejection of pulses occurring less frequently. The Field Detector logic signal is analyzed with a timing period of 350 milliseconds so that pulses occurring less frequently are rejected.

Each of the eight detector logic signals is processed to produce a refined steady logic state and its corresponding inverse. The steady logic states may be supplied to the outside for analysis at such a time as a fault is detected. These logic states are also applied to FIG. 13.

Figure 13:
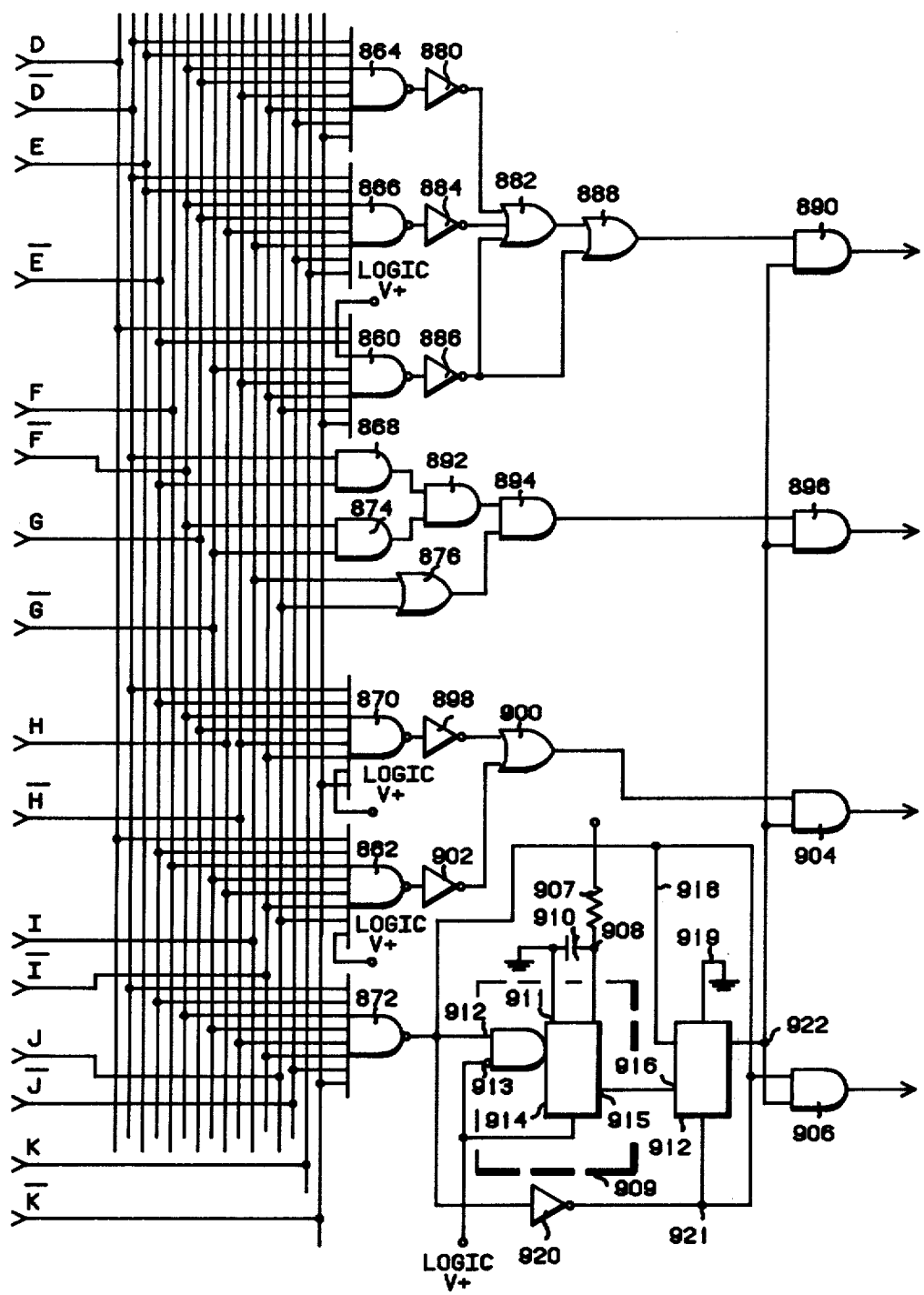
FIG. 13 is an electrical schematic of the Logic module portion of FIG. 2.

Logic Module 102 comprises a combinatorial logic circuit to suitably categorize various predetermined sequences of the logic states associated with the detectors and to classify them as corresponding to the detection of a fault in one of the major components of the alternator, voltage regulator and battery system. FIG. 13 shows the electrical schematic diagram for Logic Module 102 of FIG. 2. The 16 input signals sequentially designated D through K with corresponding inverses, are the outputs of Logic Buffer 86 of FIG. 12. Signal D is applied to the first input of an NAND gate 860, and the first input of an NAND gate 862. Signal $\overline{D}$ (inverse) is applied to the first input of an NAND gate 864, the first input of an NAND gate 866, the first input of an AND gate 868, the first input of an NAND gate 870 and the first input of an NAND gate 872. Signal E is applied to the second input of NAND 864 and the second input of NAND 866. Signal $\overline{E}$ (inverse) is applied to the second input of NAND 860, the second input of AND 868, the second input of NAND 870, the second input of NAND 862, and the second input of NAND 872. Signal F is applied to the third terminal of NAND 862. Signal $\overline{F}$ (inverse) is applied to the third input of NAND 864, the third input of NAND 866, the first input of an AND gate 874, the third input of NAND 870, and the third input of NAND 872.

Signal G is applied to the fourth input of NAND 864, the fourth input of NAND 866, and the fourth input of NAND 870. Logic V+ is applied to the third input of NAND 860. Signal $\overline{G}$ (inverse) is applied to the fourth input of NAND 860, the second input of AND 874, the fourth input of NAND 862, and the fourth input of NAND 872. Signal H is applied to the fifth input of NAND 866, and the fifth input of NAND 862. Signal $\overline{H}$ (inverse) is applied to the fifth input of NAND 864, the fifth input of NAND 860, the fifth input of NAND 870, and the fifth input of NAND 872.

Signal I is applied to the sixth input of NAND 866, and the first input of an OR gate 876. Signal $\overline{I}$ (inverse) is applied to the sixth input of NAND 864, the sixth input of NAND 860, the sixth input of NAND 870, the sixth input of NAND 862, and the sixth input of NAND 872. Signal J is applied to the seventh input of NAND 860, the second input of OR 876, and the seventh input of NAND 862. Signal $\overline{J}$ (inverse) is applied to the seventh input of NAND 864, the seventh input of NAND 866 and the seventh input of NAND 872.

Signal K is applied to the eighth input of NAND 866. Logic V+ is applied to the seventh input of NAND 870. Signal $\overline{K}$ (inverse) is applied to the eighth input of NAND 864, the eighth input of NAND 860, the eighth input of NAND 870, and the eighth input of NAND 872. Logic V+ is applied to the eighth input of NAND 862.

The output of NAND 864 is connected through an inverter 880 to the first input of an OR gate 882. The output of NAND 866 is connected through an inverter 884 to the second input of OR 882. The output of NAND 860 is connected through an inverter 886 to the third input of OR 882 and to the first input of an OR gate 888. The output of OR 882 is connected to the secod input of OR 888. The output of OR 888 is connected to the first input of an AND gate 890.

The output of AND 868 is connected to the first input of an AND gate 892. The output of AND 874 is connected to the second input of AND 892. The output of AND 892 is connected to the first input of an AND gate 894. The output of OR 876 is connected to the second input of AND 894. The output of AND 894 is connected to the first input of an AND gate 896.

The output of NAND 870 is connected through an inverter 898 to the first input of an OR gate 900, and the output of NAND 862 is connected through an inverter 902 to the second input of OR 900. The output of OR 900 is connected to the first input of an AND gate 904. The output of NAND 872 is connected to the first input of an AND gate 906.

Logic V+ is applied through a resistor 907 to a terminal 908 of a monostable multivibrator 909 shown enclosed with a broken line. Terminal 908 of multivibrator 909 is connected through a capacitor 910 to terminal 911 which is also connected to ground. The output of NAND 872 is connected to terminal 912 of multivibrator 909. Logic V+ is applied to terminals 913 and 914 of multivibrator 909.

Terminal 915 of multivibrator 909 is connected to a terminal 916 of a type D flip-flop device 917. The output of NAND 872 is connected to a terminal 918 of flip-flop 917. Terminal 919 of flip-flop 917 is connected to ground. The output of NAND 872 is connected through an inverter 920 to a terminal 921 of flip-flop 917 and to the first input of AND 906. Terminal 922 of flip-flop 917 is connected to the second inputs of AND 906, AND 904, AND 896 and AND 890.

Multivibrator 909 is preferably of the MC14528B type with the following correspondence between terminals and IC pins: terminals 908, 911, 912, 913, 914 and 915 correspond respectively to pins T1, T2, A, B, $C_D$ and Q of the IC device. The type D flip-flop 917 is preferably one-half of a MC14013B type dual IC package for which the terminal correpondence is as follows: 916, 918, 919, 921 and 922 correspond respectively to terminals C, D, S, R and Q.

The arrangement of the combinatorial logic is straight-forward and in conjunction with the logic states of FIG. 15. Logic states may be traced through the circuit to confirm that the appropriate logic level is applied to the corresponding gate so that when a predetermined sequence of circuit status detector logic states has occurred, the logic gate corresponding to the classification of this fault into one of the major components is actuated. An example will be described later. In addition, NAND 872 is coupled to all of the inverse signals and in conjunction with multivibrator 909 and flip-flop 917 sets a time period for confirmation of the persistence of the detected sequence of logic states to indicate that a true fault has occurred. While any of several times may be appropriate for such a confirmation, a period of 5.5 seconds has been found to be appropriate to provide confirmation. This time period is deemed sufficient to prevent the annoyance to the operator of a frequently illuminated or sporadically flashing lamp 68. If, after the period of 5.5 seconds, one of the circuit status detectors changes it logic signal, multivibrator 909 is reset. This reset causes lamp 68 to be extinguished along with any of the display devices and prepares the circuit to detect the occurrence of another confirmed fault. The only variation in this procedure results from the latching function provided by the High Voltage Detector which, once activated, will remain latched to indicate a fault until ignition switch 70 is opened.

The classification of the fault as occurring in the alternator, voltage regulator and battery system is directly dependent upon the interconnection of the logic circuit. It may be observed by tracing through the logic states shown in FIG. 15, AND 890 will have a high level output for only five possible sequences of logic output states, AND 896 will have a high level output corresponding to only four possible sequences of logic output states, and AND 904 will have a high level output only for three logic state sequences. It should also be appreciated that AND gate 906 will have a high level output when the sequence of logic states is other than the 12 sequences listed in FIG. 15. Although only 12 sequences are detectable by Logic Module 102, additional sequences of logic states may be utilized to identify additional faults in various components of the alternator, voltage regulator and battery system. It will also be appreciated that additional sensing detectors may be used to identify still further faults or to further classify a fault. The scope of the invention is not limited to the detection of the 12 predetermined faults listed.

The outputs of Logic Module 102 are applied to Display Driver 104 which provides transistor drivers for the operation of display devices to indicate the occurrence of a fault and its classification into one of the major components of the alternator, voltage regulator and battery system.

Figure 14:
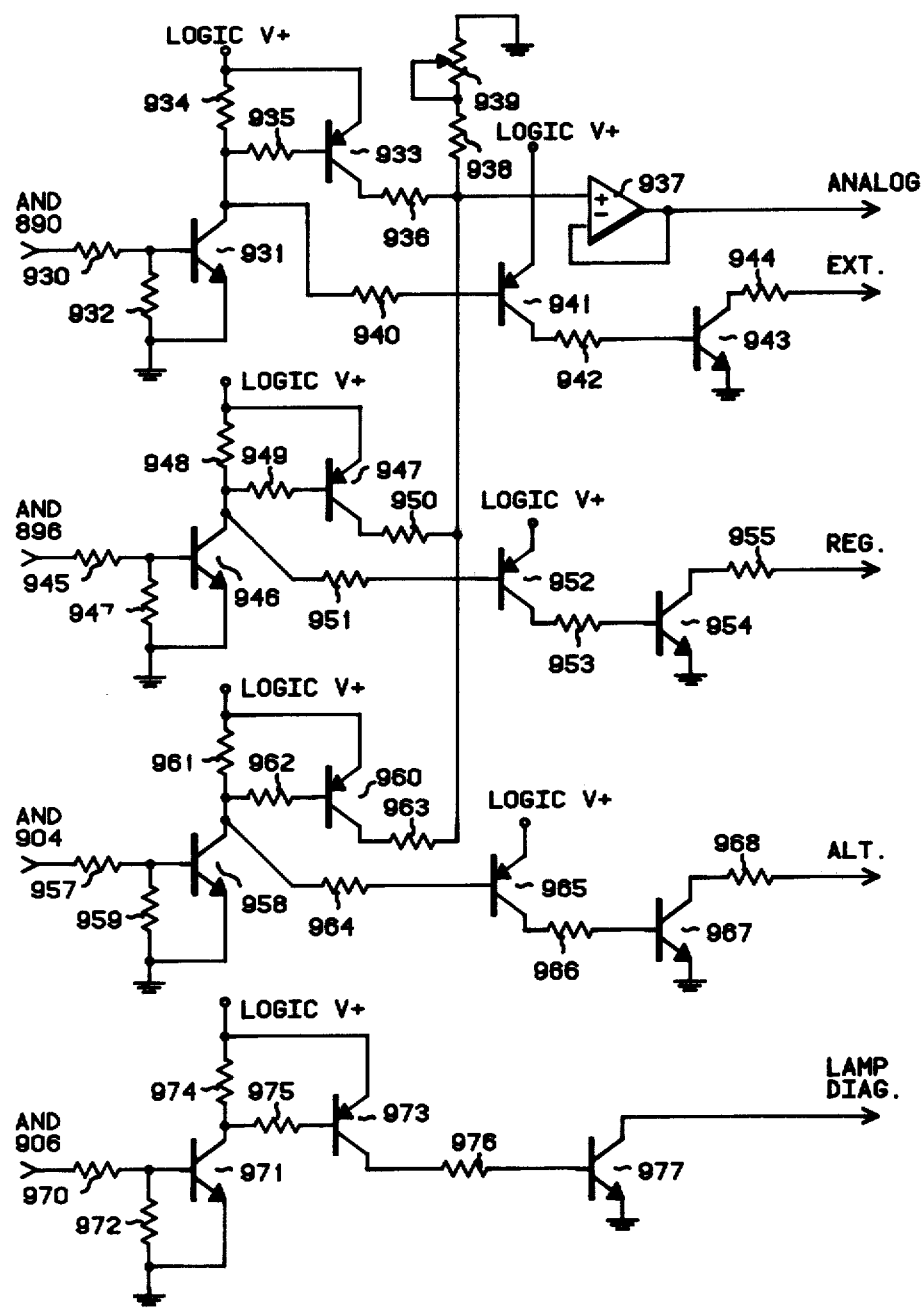
FIG. 14 is an electrical schematic of the Display Driver portion of FIG. 2.

FIG. 14 shows the detailed electrical schematic for Display Driver 104 of FIG. 2. In particular, the output from AND 890 of FIG. 13 is applied through a resistor 930 to the base of an NPN transistor 931. The base of transistor 931 is connected through a resistor 932 to ground. The emitter of transistor 931 is also connected to ground. Logic V+ is applied to the emitter of a PNP transistor 933 and through a resistor 934 to the collector of transistor 931. The collector of transistor 931 is connected through a resistor 935 to the base of transistor 933. The collector of transistor 933 is connected through a resistor 936 to the positive input terminal of an operational amplifier 937. The positive input terminal of OP AMP 937 is also connected through a resistor 938 in series with a variable resistor 939 which is connected to ground. The output of OP AMP 937 is directly connected to the negative input terminal and at the output is a signal ANALOG.

The collector of transistor 931 is connected through a resistor 940 to the base of a PNP transistor 941. Logic V+ is applied to the emitter of transistor 941. The collector of transistor 941 is connected through a resistor 942 to the base of an NPN transistor 943 whose emitter is connected to ground. The collector of transistor 943 is connected through a resistor 944 to produce an output signal EXT.

The output from AND 896 of FIG. 13 is connected through a resistor 945 to the base of an NPN transistor 946. The base of transistor 946 is also connected through a resistor 947 to ground. The emitter of transistor 946 is also connected to ground. Logic V+ is applied to the emitter of a PNP transistor 947 and through a resistor 948 to the collector of transistor 946. The collector of transistor 946 is also connected through a resistor 949 to the base of transistor 947. The collector of transistor 947 is connected through a resistor 950 to the positive input terminal of OP AMP 937.

The collector of transistor 946 is connected through a resistor 951 to the base of a PNP transistor 952. Logic V+ is applied to the emitter of transistor 952. The collector of transistor 952 is connected through a resistor 953 to the base of an NPN transistor 954 whose emitter is connected to ground. The collector of transistor 954 is connected through a resistor 955 to produce an output signal RGR.

The output from AND 904 of FIG. 13 is connected through a resistor 957 to the base of an NPN transistor 958. The base of transistor 958 is connected through a resistor 959 to ground. The emitter of transistor 958 is also connected through a resistor 959 to ground. The emitter of transistor 958 is also connected to ground. Logic V+ is applied to the emitter of a PNP transistor 960 and through a resistor 961 to the collector of transistor 958. The collector of transistor 958 is also connected through a resistor 962 to the base of transistor 960. The collector of transistor 960 is connected through a resistor 963 to the positive input terminal of OP AMP 937.

The collector of transistor 958 is also connected through a resistor 964 to the base of a PNP transistor 965. Logic V+ is applied to the emitter of transistor 965 and its collector is connected through a resistor 966 to the base of a PNP transistor 967. The emitter of transistor 967 is connected to ground. The collector of transistor 967 is connected through a resistor 968 to produce an output signal ALT.

The output of AND 906 from FIG. 13 is connected through a resistor 970 to the base of an NPN transistor 971. The base of transistor 971 is connected through a resistor 972 to ground. Logic V+ is applied to the emitter of a PNP transistor 973 and through a resistor 974 to the collector of transistor 971. The collector of transistor 971 is also connected through a resistor 975 to the base of transistor 973. The collector of transistor 973 is connected through a resistor 976 to the base of an NPN transistor 977, whose emitter is connected to ground. At the collector of transistor 977 is an output signal LAMP DIAG.

OP AMP 937 is preferably one device of the dual package of amplifiers of the IC designated LM2904 which has been previously described for earlier figures. While neither a voltage input nor ground is shown for this operational amplifier it should be clear that one of the previously unused devices in dual or quad packages described for earlier figures may be utilized for this figure and those skilled in the art would by fully capable of supplying both Logic V+ and a ground to such an amplifier.

The outputs of AND 890, 896, and 904 are coupled through OP AMP 937 to provide an output designated ANALOG. In the alternative to the use of a lamp display to indicate the classification of the fault, the ANALOG signal at the output of OP AMP 937 provides four separate voltage levels corresponding to: the normal operating condition, the existence of a fault in the external circuit (EXT), the regulator (RGR), or the alternator (ALT). This is intended to be an alternative to the display device scheme but can also be used in conjunction with it.

The output of AND 906 is also coupled through suitable transistor drivers to produce a signal LAMP DIAG. It should be recalled that the LAMP DIAG signal is applied to FIG. 3 and will cause lamp 68 in FIG. 1 to turn on to indicate to the operator that a problem has arisen in his alternator, voltage regulator, battery system. Lamp 68 always comes on in conjuncton with one of the categorizations of a detected fault as having occurred in one of the major components of the alternator battery system but this warning that a fault has occurred does not provide any information as to the nature of the fault.

With additional investigation on the part of either a mechanic or the operator, the determination can be made as to whether or not the detected fault has occurred in one of the major components. This would be indicated by the illumination of one of the EXT, RGR, or ALT lights. If, however, lamp 68 is illuminated under ordinary driving conditions and none of the ALT, EXT, or RGR display lamps are illuminated, then the fault detected is of a type which cannot be classified or which constitutes a multiple fault.

At such a time, additional analysis is obtained by accessing the logic state outputs of Logic Buffer 86 as shown in FIG. 12. By sequentially accessing the logic states corresponding to each of the circuit status detectors, one can determine precisely the sequence of logic states and with this information identify precisely the nature of the fault. With this information, the appropriate repair may be instituted.

FIG. 15 shows a logic state diagram for the eight circuit status detectors identifying the major faults in the alternator, voltage regulator and battery system. In particular the first five logic state sequences correspond to identified faults which may occur in the external (EXT) circuit, which is generally defined as not within the alternator or voltage regulator. The next group of four logic state sequences correspond to identified faults which may occur in the regulator (RGR). The last three logic state sequences identify faults which may occur in the alternator (ALT). FIG. 15 lists the 12 sequences of circuit status detector logic states which identify faults in the major components of the alternator, voltage regulator and battery system. The sequence of alphabetic characters corresponds to the identification of logic state outputs for the circuit status detectors. For all of the eight circuit status detectors, the normal state is 0.

To more fully understand the operation of the generation and classification of logic states for the circuit status detectors, consider the example of the occurrence of the shorted field fault for which the logic state sequence is listed in FIG. 15. Physically, either of two conditions might have occurred: the field coil itself could be shorted or the flyback diode which is in parallel with the field coil could be shorted. The two physical conditions are indistinguishable with the present set of circuit status detectors. In either case, there would be no voltage difference at terminals FC+ and FC−, and this would be correctly classified with the present detectors as a fault in the alternator.

Reviewing the circuit status detectors and the logic states at Logic Buffer 86 for the shorted field fault, at the occurrence of the fault the Darlington Detector (K) would produce a 1 logic level because the duty cycle of the Darlington Drive signal would not be equal to the duty cycle of the Darlington amplifier output (FIELD−). The Low Voltage Detector (J) would be at 1 because the system voltage had fallen below an acceptable limit since there is no output from the alternator. The High Voltage Detector (I) would remain at 0. The Field Detector (H) would be at 1 because the flyback voltage detected each cycle would not be present since shutting down the Darlington Drive signal there would not be a one diode voltage drop exhibited by the inductance of the field coil. It should be recalled that this detector detects anything less than a one diode drop during the sampling interval. The Stator Detector (G) would remain at 0. The Phase Detector (F) would be at 1 indicating that there is no alternator output. The Ripple Detector (E) would be unaffected by the occurrence of this fault. The Voltage Sense Detector (D) would be at 1 because of the loss of the phase signal which also caused the Phase Detector to indicate a fault. The resulting sequence of logic states from left to right as Voltage Sense Detector to Darlington Detector is: 10101011.

By serially inspecting the individual logic states of the detectors, one can deduce the most probable faults in the system causing these logic states. The Sense Detector at 1 could be caused by a broken belt, a disconnected terminal S, an open field coil, or a shorted field coil. The addition of a normal logic state for the Ripple Detector adds little to the possible causes. When the Phase Detector logic state is considered to form the sequence 101, the unplugged terminal S is eliminated as a possible fault. The addition of a normal logic state for the Stator Detector also adds little information. The addition of the Field Detector logic state at 1 eliminates the possibility of a broken belt and forms a binary sequence 10101. The possible diagnosis has now been reduced to a fault due to either an open or shorted field. It should be realized that both of these faults are classified as in the alternator.

The addition of a 0 logic state for the High Voltage Detector adds little to the analysis as does the addition of a logic state of 1 for Low Voltage signal. The sequence has now become 1010101. The addition 1 logic state for the Darlington Detector clearly eliminates the possibility of an open field, since for the open field the Darlington amplifier signal would be 0. Thus, the binary representation 10101011 representing the sequence of logic signals for the circuit status detectors uniquely defines the fault to be due to a shorted field coil and this sequence of logic states is applied to Logic Module 102.

By tracing through the interconnections, it will be observed that NAND 862 responds to D, Ē (inverse), F, Ḡ (inverse), H, I (inverse), J and the corresponding levels of these signals are all one. The K signal is not used in this case since the fault has already been determined to be in the alternator. Thus, the output of NAND 862 is 0 and the output of inverter 902 is 1. The output of OR 900 must be at 1 and the first input of AND 904 is therefore 1. So long as the signal persists for the 5.5 second true fault confirmation time-out period provided by multivibrator 909 connected to flip-flop 917, the 1 output of AND 904 will actuate the ALT display device.

Numerous other examples of the logic state sequences shown in FIG. 15 may be traced through the Logic Module to verify that this circuit operates to correctly classify the sequence of the logic states as corresponding to a fault having occurred in one of the major components of the electrical system.

The preferred embodiment has been described with the use of discrete components. However, it should be clear that, except for certain capacitors and large current handling devices, the logic circuitry may be implemented on a single integrated circuit. This integrated circuit could also be used for the voltage regulator circuit and the previously discussed advantages of combining the various circuit functions could easily be realized by current technology.

While a specific embodiment of this invention has been shown and described, further modifications and improvements will occur to those skilled in the art. All modifications which retain the basic underlying principles disclosed and claimed herein are within the scope of this invention.

We claim:

1. An in situ self-diagnostic automotive alternator-battery charging system comprising:
   a battery;
   voltage regulator means sensing battery voltage and generating an excitation signal in response thereto;
   alternator means coupled to said battery and said voltage regulator means, driven by a vehicle engine, providing a rectified electrical signal for charging said battery in response to said excitation signal;
   a plurality of electronic circuit status detectors, each of said plurality maintaining a first logic state when a corresponding electrical signal characteristic is within a predetermined range and a second logic state when said electrical signal characteristic is outside said predetermined range, selected ones of said plurality being coupled to said battery, voltage regulator means and said alternator means with at least one of said electronic circuit status detectors including resettable timing means establishing time intervals for the detection of repetitive occurrences of pulse signals; and logic means coupled to said plurality of circuit status detectors and responsive to the logic output states of said circuit status detectors, identifying predetermined sequences of logic states thereby to identify the occurrence of faults in said charging system.

2. The battery charging system of claim 1 wherein one of said electronic circuit status detectors includes means to detect the operation of said alternator and to produce logic signals corresponding to the operative and inoperative status of said alternator.

3. The battery charging system of claim 2 wherein said detector having means to detect the operation of said alternator further includes means to monitor phase signals from said alternator, the continued detection of which results in production of said alternator a logic signal indicative of alternator operation.

4. The battery charging system of claim 3 wherein said logic means further includes power supply means, responsive to logic signals from said status detector for detection of the operation of said alternator, for supplying power to operate said voltage regulator means only when said alternator means operation has been detected.

5. The battery charging system of claim 4 wherein said logic means further includes combinatorial logic circuits to identify the occurrence of predetermined sequences of said logic states.

6. The battery charging system of claim 5 wherein said logic means further includes sequence timing means, establishing a minimum time interval during which a predetermined sequence of logic states must be maintained, to confirm the identification of a fault.

7. The battery charging system of claim 6 wherein said logic means further includes display means, responsive to the termination of said minimum time interval of said sequence timing means, for warning the operator of the detection of a fault and providing additional signals indicative of the location of the detected fault in said battery charging system.

8. The battery charging system of claim 7 wherein said logic means further includes reset means operative after disruption of a confirmed sequence of logic states to reset said sequence timing means to re-establish the minimum time interval.

9. The battery charging system of claim 8 wherein said plurality of circuit status detectors and said logic means are made integral with the circuitry for said voltage regulator means.

10. An in situ self-diagnostic automotive alternator-battery charging system comprising:
a battery;
voltage regulator means sensing battery voltage and in response to an actuating signal, generating an excitation signal in response to the sensed battery voltage;
alternator means coupled to said voltage regulator means and selectively coupled to said battery, driven by a vehicle engine, providing a rectified electrical signal for charging said battery in response to said excitation signal;
an ignition switch for establishing coupling of said battery to said alternator means;
a plurality of electronic circuit status detectors powered by said automotive charging system, each of said plurality being coupled to said battery or alternator means by isolating transistors preventing the flow of electrical current through said detectors when said ignition switch is open,
each of said plurality of detectors maintaining a first logic state when a corresponding electrical signal characteristic is within a predetermined range and a second logic state when said electrical signal characteristic is outside said predetermined range, selected ones of said plurality being coupled to said battery, voltage regulator means and said alternator means;
one of said plurality of said electronic circuit status detectors being coupled to said alternator and including means to detect the operation of said alternator and producing logic signals corresponding to the operative and inoperative status of said alternator;
logic means coupled to said plurality of circuit status detectors and including power supply means, responsive to logic signals from said status detector for detection of the operation of said alternator, for supplying said actuating signal to said voltage regulator means when said alternator means operation has been detected,
said logic means being responsive to the logic output states of said circuit status detectors, identifying predetermined sequences of logic states thereby to identify the occurrence of faults in said charging system.

11. The battery charging system of claim 10 wherein at least one of said electronic circuit status detectors includes resettable timing means establishing time intervals for the detection of repetitive occurrences of pulse signals.

12. The battery charging system of claim 11 wherein said logic means further includes combinatorial logic circuits to identify the occurrence of predetermined sequences of said logic states.

13. The battery charging system of claim 12 wherein said logic means further includes sequence timing means, establishing a minimum time interval during which a predetermined sequence of logic states must be maintained, to confirm the identification of a fault.

14. The battery charging system of claim 13 wherein said logic means further includes display means, responsive to the termination of said minimum time interval of said sequence timing means, for warning the operator of the detection of a fault and providing additional signals indicative of the location of the detected fault in said battery charging system.

15. The battery charging system of claim 14 wherein said logic means further includes reset means operative after disruption of a confirmed sequence of logic states to reset said sequence timing means to re-establish the minimum time interval.

16. The battery charging system of claim 15 wherein said alternator means further includes an indicator lamp connected to said ignition switch and said logic power supply means, the illumination of said indicator lamp causing the establishment of initial excitation current for said alternator means through said power supply means.

17. The battery charging system of claim 16 wherein said display means further includes means to cause illumination of said indicator lamp to warn the operator of the detection of a fault in the system.

18. The battery charging system of claim 17 wherein one of said electronic circuit status detectors detects a voltage exceeding a predetermined maximum range and said high voltage detector further includes protection means for interrupting the excitation signal supplied by said voltage regulator means to said alternator means when said voltage exceeding a maximum range is detected.

19. The battery charging system of claim 18 wherein said high voltage detector further includes latching means to disable said automobile system by continued interruption of said excitation signal until said ignition switch is opened.

20. The battery charging system of claim 19 wherein said plurality of circuit status detectors and said logic means are made integral with the circuitry for said voltage regulator means.

21. An in situ fault diagnostic apparatus for attachment to and permanent integration with an automotive alternator, voltage regulator, and battery system comprising:
a plurality of electronic circuit status detectors each of said plurality maintaining a first logic state when a corresponding electrical signal characteristic is within a predetermined range and a second logic state when said electrical signal characteristic is outside said predetermined range, selected ones of said plurality being coupled to said battery, voltage regulator means and said alternator means with at least one of said electronic circuit status detectors including resettable timing means establishing time intervals for the detection of repetitive occurrences of pulse signals; and
logic means coupled to said plurality of circuit status detectors and responsive to the logic output states of said circuit status detectors, identifying the occurrence of predetermined sequences of said logic states, thereby to identify the occurrence of faults in the charging system.

22. The fault diagnostic apparatus of claim 21 wherein one of said electronic circuit status detectors includes means to detect the operation of said alternator and to produce logic signals corresponding to the operative and inoperative status of said alternator.

23. The fault diagnostic apparatus of claim 22 wherein said detector having means to detect operation of said alternator further includes means to monitor phase signals from said alternator, the continued detection of which results in the production of a logic signal indicative of alternator operation.

24. The fault diagnostic apparatus of claim 23 wherein said logic means further includes power supply means, responsive to logic signals from said status detector for detection of the operation of said alternator, for supplying power to operate said voltage regulator means only when said alternator means operation has been detected.

25. The fault diagnostic apparatus of claim 24 wherein said logic means further includes combinatorial logic circuits to identify the occurrence of predetermined sequences of logic states.

26. The fault diagnostic apparatus of claim 25 wherein said logic means further includes sequence timing means, establishing a minimum time interval during which a predetermined sequence of logic states must be maintained, to confirm the identification of a fault.

27. The fault diagnostic apparatus of claim 26 wherein said logic means further includes display means, responsive to the termination of said minimum time interval of said sequence timing means, for warning the operator of the detection of a fault and providing additional signals indicative of the location of the detected fault in said automotive system.

28. The fault diagnostic apparatus of claim 27 wherein said logic means further includes reset means operative after disruption of a confirmed sequence of logic states to reset said sequence timing means to re-establish the minimum time interval.

29. The fault diagnostic apparatus of claim 28 wherein said plurality of circuit status detectors and said logic means are made integral with the circuitry for said voltage regulator means.

30. The method of electronically diagnosing faults in the performance of an automotive alternator, voltage regulator, and battery system comprising the steps of:
providing a plurality of electronic circuit status detectors at preselected positions in said system to monitor predetermined electrical signal characteristics;
supplying in situ power to said electronic status detectors from said automotive system;
establishing normal operating ranges for said predetermined electrical signal characteristics such that each of said circuit status detectors maintains a first logic state when said corresponding signal characteristic is within said operating range and a second logic state when said signal characteristic is outside said operating range, including selecting one of said plurality of electronic circuit status detectors and establishing time intervals for detecting the regular occurrence of pulse signals; and
monitoring said logic states of said plurality of circuit status detectors for predetermined sequences of said logic states, thereby to identify the occurrence of faults in the system.

31. The method of claim 30 wherein the step of establishing normal operating ranges further includes the step of selecting one of said plurality of electronic circuit status detectors for detecting the operation of said alternator.

32. The method of claim 31 wherein the step of detecting includes the steps of testing for the continued reoccurrence of phase signals from said alternator and generating a signal indicative of the operation of said alternator upon said reoccurrence.

33. The method of claim 32 wherein after the step of generating a signal is included the step of supplying power to establish operation of said voltage regulator.

34. The method of claim 33 wherein the step of monitoring said logic states includes the step of comparing the duration of a logic state sequence with a predetermined time interval to confirm the detection of a fault.

35. The method of claim 34 wherein the step of monitoring said logic states further includes the steps of classifying said logic state sequences as to location of the detected fault and displaying an indication of said classification.

36. The method of claim 35 wherein after the step of displaying is included the step of terminating the display of an indication of said classification upon disruption of the duration of said logic state sequence.

* * * * *